(12) United States Patent
Furukawa et al.

(10) Patent No.: US 9,887,106 B2
(45) Date of Patent: Feb. 6, 2018

(54) EJECTION INSPECTION APPARATUS AND SUBSTRATE PROCESSING APPARATUS

(71) Applicant: DAINIPPON SCREEN MFG. CO., LTD., Kyoto-shi, Kyoto (JP)

(72) Inventors: Itaru Furukawa, Kyoto (JP); Hiroshi Sano, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 673 days.

(21) Appl. No.: 14/207,232

(22) Filed: Mar. 12, 2014

(65) Prior Publication Data
US 2014/0261577 A1    Sep. 18, 2014

(30) Foreign Application Priority Data

Mar. 14, 2013   (JP) .............................. P2013-052192
Mar. 14, 2013   (JP) .............................. P2013-052193
Mar. 14, 2013   (JP) .............................. P2013-052194

(51) Int. Cl.
*H01L 21/67*    (2006.01)
*G06T 7/00*    (2017.01)
*G06T 7/194*    (2017.01)

(52) U.S. Cl.
CPC ...... *H01L 21/67023* (2013.01); *G06T 7/0004* (2013.01); *G06T 7/194* (2017.01); *H01L 21/67051* (2013.01); *H01L 21/67253* (2013.01); *G06T 2207/10016* (2013.01); *G06T 2207/30148* (2013.01)

(58) Field of Classification Search
CPC . A47L 15/4234; A47L 15/00; H01L 21/67051
See application file for complete search history.

(56) References Cited

U.S. PATENT DOCUMENTS

2006/0234503 A1   10/2006  Yamada et al.
2008/0100809 A1    5/2008  Nakashima et al.
2008/0211842 A1    9/2008  Kusakari et al.
(Continued)

FOREIGN PATENT DOCUMENTS

CN    101927610 A    12/2010
JP    11-329936      11/1999
(Continued)

*Primary Examiner* — Jason Ko
(74) *Attorney, Agent, or Firm* — McDermott Will & Emery LLP

(57) ABSTRACT

An ejection inspection part of a substrate processing apparatus includes a light emitting part and an imaging part. The light emitting part emits light along a predetermined light existing plane to irradiate a processing liquid ejected from outlets of an ejection head with the light. The imaging part captures an image of the processing liquid passing through planar light emitted from the light emitting part to acquire an inspection image including bright dots. In the ejection inspection part, a determination frame setting part sets normal ejection determination frames corresponding to the outlets in the inspection image. The determination part acquires existence information indicating whether or not a bright dot exists in each normal ejection determination frame and uses the existence information to determine the quality of the ejection operation of the outlet corresponding to the normal ejection determination frame. It is thus possible to individually and accurately determine the quality of the ejection operations of the outlets.

21 Claims, 16 Drawing Sheets

(56) References Cited

U.S. PATENT DOCUMENTS

2011/0286738 A1 11/2011 Node et al.
2012/0222707 A1 9/2012 Sato et al.

FOREIGN PATENT DOCUMENTS

| | | |
|---|---|---|
| JP | 2003-272986 A | 9/2003 |
| JP | 2005-021755 A | 1/2005 |
| JP | 2005-118756 | 5/2005 |
| JP | 2008-135679 A | 6/2008 |
| JP | 2011-233571 | 11/2011 |
| JP | 2012-9812 A | 1/2012 |
| JP | 2012-106148 | 6/2012 |
| JP | 2012-209513 A | 10/2012 |
| KR | 10-2009-0107410 A | 10/2009 |
| KR | 10-2011-0094043 A | 8/2011 |
| TW | 201111059 A | 4/2011 |

EJECTION INSPECTION APPARATUS AND SUBSTRATE PROCESSING APPARATUS

TECHNICAL FIELD

The present invention relates to an ejection inspection apparatus for inspecting an operation of ejecting a liquid from a plurality of outlets and to a substrate processing apparatus including the ejection inspection apparatus.

BACKGROUND ART

The process of manufacturing semiconductor substrates (hereinafter, simply referred to as "substrates") conventionally involves various types of processing performed on substrates having insulation films such as an oxide film by a substrate processing apparatus. One example is cleaning processing for removing particles or the like adhering to the surface of a substrate by supplying a cleaning liquid to the substrate surface.

Japanese Patent Application Laid-Open No. 11-329936 (Document 1) discloses a substrate processing apparatus for ejecting a photoresist liquid toward a substrate from a single processing liquid supply nozzle disposed above the substrate. The substrate processing apparatus includes a CCD camera directed between the processing liquid supply nozzle and the substrate in order to capture an image of a liquid column of the processing liquid ejected from the processing liquid supply nozzle. The width of the captured liquid column of the processing liquid (i.e., the width of ejection of the processing liquid from the processing liquid supply nozzle) is compared with a predetermined reference width, and a captured liquid column smaller in width than the reference width is detected as an ejection abnormality.

Japanese Patent Application Laid-Open No. 2003-272986 (Document 2) discloses a substrate processing apparatus for applying a developer onto a stationary held substrate from slit outlets of a developer-discharge nozzle. The substrate processing apparatus includes an illuminator for irradiating a substrate with light and a light detection part for detecting light reflected off a processing liquid on a substrate. The light detection part captures an image of the entire surface of a substrate with a CCD camera and detects a developer supply defective area where the developer has not collected on the substrate on the basis of a difference in lightness between the developer supply defective area and the other areas.

Japanese Patent Application Laid-Open No. 2008-135679 (Document 3) discloses a liquid treatment apparatus for supplying a coating liquid onto a substrate from a coating liquid nozzle. The liquid treatment apparatus is configured such that the coating liquid nozzle is transported between a position above the substrate and a nozzle bus serving as a standby position, and an image of the tip portion of the coating liquid nozzle is captured during transport. On the basis of the result of the image capture, the liquid treatment apparatus detects occurrence of trickling or dripping of liquid from the tip portion of the coating liquid nozzle.

Japanese Patent Application Laid-Open No. 2012-9812 (Document 4) discloses a liquid processing device for supplying a treatment liquid onto a substrate from a treatment liquid nozzle. The liquid processing device includes 11 nozzles that are arranged in a straight line and held by a nozzle head part. Areas from the tip portions of these nozzles to the surface of a substrate is irradiated with a line of laser light, and images of liquid columns of a resist liquid ejected from the respective nozzles are captured with a camera directed to the areas. Then, the result of the image capture is compared with reference information, which is obtained in advance by capturing images of the resist liquid ejected normally from the nozzles, so as to determine whether or not the resist liquid is ejected from the nozzles and whether or not the ejection state has changed.

Japanese Patent Application Laid-Open No. 2012-209513 (Document 5) discloses a substrate processing apparatus for ejecting fine droplets of a processing liquid toward a substrate from a plurality of outlets. The substrate processing apparatus includes a plurality of outlet rows, each having a plurality of outlets arranged in a line.

With the apparatus as disclosed in Document 5, a plurality of outlet rows each having a large number of outlets are arranged in a direction that intersects with the direction of arrangement of the outlets, and accordingly fine droplets ejected from the respective outlets overlap one another. Thus, even if the user attempts to determine whether or not the processing liquid is ejected from each of the outlets, it is not easy to identify which droplet correspond to which outlet.

One example of ejection abnormalities of fine droplets is oblique ejection that refers to ejection in a direction deviating from a predetermined ejection direction. As a method of detecting such oblique ejection, it is conceivable to compare the intervals between fine droplets with a normal value. It is, however, not easy to judge either normal ejection or oblique ejection because the intervals between fine droplets ejected from outlets located close to an observation point looks large while the intervals between fine droplets ejected from outlets located furthest from the observation point looks small. The size of each fine droplet also varies depending on the distance from the observation point.

SUMMARY OF INVENTION

The present invention is intended for an ejection inspection apparatus for inspecting an operation of ejecting a liquid from a plurality of outlets, and it is an object of the present invention to accurately determine the quality of the ejection operation of each of the outlets. The present invention is also intended for a substrate processing apparatus.

The ejection inspection apparatus according to the present invention includes a light emitting part for emitting light along a predetermined light existing plane to irradiate a plurality of flying droplets passing through the light existing plane with the light, the plurality of flying droplets being a liquid ejected from a plurality of outlets, an imaging part for capturing an image of the plurality of flying droplets passing through the light existing plane to acquire an inspection image that includes a plurality of bright dots appearing on the plurality of flying droplets, a determination frame setting part for setting, in the inspection image, a plurality of normal ejection determination frames corresponding respectively to the plurality of outlets, and a determination part for acquiring existence information that indicates whether or not a bright dot exists in each of the plurality of normal ejection determination frames and determining quality of an ejection operation of an outlet corresponding to the each normal ejection determination frame on the basis of the existence information. The ejection inspection apparatus enables the quality of the ejection operation of each of the outlets to be accurately determined.

In a preferred embodiment of the present invention, the ejection inspection apparatus further includes a bright dot correction part for correcting a size of each of the plurality of bright dots in the inspection image on the basis of a length of an inspection distance that is a distance between the imaging part and a bright dot reference position, the bright dot reference position being a point of intersection of the light existing plane and a center line of ejection that extends from each of the plurality of outlets in a design ejection direction of the plurality of flying droplets. The existence information is information indicating whether or not at least a portion of a bright dot corrected by the bright dot correction part exists in the each normal ejection determination frame.

More preferably, the bright dot correction part performs correction to decrease the size of the each bright dot as the inspection distance decreases. The bright dot correction part also performs correction to decrease the size of the each bright dot as a difference between the inspection distance and an in-focus distance of the imaging part increases. The ejection inspection apparatus further includes a light thickness correction part for reducing a size of the each bright dot in the ejection direction as a difference between an irradiation distance and a distance from the light emitting part to a light thinnest position increases, the irradiation distance being a distance between the light emitting part and the bright dot reference position in a direction parallel to an optical axis between the light emitting part and the bright dot reference position, and the light thinnest position being a position at which the light emitted from the light emitting part has a smallest thickness in the ejection direction.

In another preferred embodiment of the present invention, the determination frame setting part includes a provisional setting part for provisionally setting, in the inspection image, a normal ejection determination frame of a predetermined size in correspondence with each of the plurality of outlets, the normal ejection determination frame centering on a bright dot reference position that is a point of intersection of the light existing plane and a center line of ejection that extends from the each outlet in a design ejection direction of the plurality of flying droplets, and a frame size adjustment part for adjusting each normal ejection determination frame provisionally set by the provisional setting part on the basis of an inspection distance that is a distance between the bright dot reference position and the imaging part.

More preferably, the frame size adjustment part performs adjustment to decrease the size of the each normal ejection determination frame as the inspection distance increases. The frame size adjustment part also performs adjustment to decrease the size of the each normal ejection determination frame as a difference between the inspection distance and an in-focus distance of the imaging part increases. The frame size adjustment part further includes a light thickness adjustment part for reducing the size of the each normal ejection determination frame in the ejection direction as a difference between an irradiation distance and a distance between the light emitting part and a light thinnest position increases, the irradiation distance being a distance between the light emitting part and the bright dot reference position in a direction parallel to an optical axis between the light emitting part and the bright dot reference position, and the light thinnest position being a position at which the light emitted from the light emitting part has a smallest thickness in the ejection direction.

In yet another preferred embodiment of the present invention, an imaging direction of the imaging part inclines relative to a plane perpendicular to the ejection direction.

In yet another preferred embodiment of the present invention, the light existing plane inclines relative to a plane perpendicular to the ejection direction.

In yet another preferred embodiment of the present invention, the plurality of outlets are linearly arranged, and the determination frame setting part sets positions of the plurality of normal ejection determination frames on the basis of positions of bright dots that are located at opposite ends among the plurality of bright dots included in the inspection image.

In yet another preferred embodiment of the present invention, the determination frame setting part sets a plurality of oblique ejection determination frames respectively around the plurality of normal ejection determination frames, and the determination part determines occurrence or non-occurrence of an oblique ejection at an outlet corresponding to each of the plurality of oblique ejection determination frames on the basis of existence information indicating whether or not a bright dot exists in the each oblique ejection determination frame. More preferably, the determination frame setting part sets a single outer ejection determination frame around the plurality of oblique ejection determination frames, and the determination part determines occurrence or non-occurrence of very oblique ejection on the basis of existence information indicating whether or not a bright dot exists in the outer ejection determination frame.

In yet another preferred embodiment of the present invention, the determination frame setting part sets a single oblique ejection determination frame around the plurality of normal ejection determination frames, and the determination part determines occurrence or non-occurrence of an oblique ejection on the basis of existence information indicating whether or not a bright dot exists in the oblique ejection determination frame. More preferably, the determination frame setting part sets a single outer ejection determination frame around the oblique ejection determination frame, and the determination part determines occurrence or non-occurrence of very oblique ejection on the basis of existence information indicating whether or not a bright dot exists in the outer ejection determination frame.

In yet another preferred embodiment of the present invention, the determination part obtains a centroid of each of the plurality of bright dots in the inspection image and acquires existence or non-existence of the centroid of a bright dot in the each normal ejection determination frame as the existence information indicating whether or not a bright dot exists in the each normal ejection determination frame.

A substrate processing apparatus according to an aspect of the present invention includes a substrate holding part for holding a substrate, an ejection head for ejecting a liquid from a plurality of outlets toward the substrate and performing predetermined processing on the substrate, and the aforementioned ejection inspection apparatus for inspecting an operation of the ejection head ejecting a liquid from the plurality of outlets. More preferably, the substrate processing apparatus further includes a protection liquid supply part for supplying a protection liquid onto the substrate to form a protection liquid film that covers a plurality of design landing positions, on the substrate, of the liquid ejected from the plurality of outlets.

A substrate processing apparatus according to another aspect of the present invention includes a substrate holding part for holding a substrate, a protection liquid supply part for supplying a protection liquid onto the substrate to form a protection liquid film that covers a portion of the substrate, an ejection head for ejecting a liquid from a plurality of outlets toward the protection liquid film formed on the substrate to perform predetermined processing on the substrate, and an ejection inspection apparatus for inspecting an operation of the ejection head ejecting a liquid from the plurality of outlets. The ejection inspection apparatus includes a light emitting part for emitting light along a predetermined light existing plane to irradiate a plurality of flying droplets passing through the light existing plane with the light, the plurality of flying droplets being the liquid ejected from the plurality of outlets, an imaging part for capturing an image of the plurality of flying droplets passing through the light existing plane to acquire an inspection image that includes a plurality of bright dots appearing on the plurality of flying droplets, a determination frame setting part for setting, in the inspection image, a protection-liquid-film ejection determination frame and an outer ejection determination frame, the protection-liquid-film ejection determination frame corresponding to the protection liquid film formed on the substrate, and the outer ejection determination frame surrounding the protection-liquid-film ejection determination frame, and a determination part for acquiring existence information indicating whether or not a bright dot exists in the outer ejection determination frame and determining occurrence or non-occurrence of landing of the liquid in an area outside the protection liquid film on the basis of the existence information.

More preferably, the protection-liquid-film ejection determination frame in the inspection image is set on the basis of positions of peripheral outlets that are located in a peripheral portion of an outlet arrangement area in which the plurality of outlets are provided in the ejection head, a position of a peripheral portion of the protection liquid film on the substrate, and a position of the light existing plane located between the peripheral outlets and the protection liquid film.

In a preferred embodiment of the substrate processing apparatus according to the present invention, processing for cleaning the substrate is performed by the plurality of outlets ejecting fine droplets of the liquid serving as a cleaning liquid and by the fine droplets transferring kinetic energy to the substrate through the protection liquid film.

These and other objects, features, aspects and advantages of the present invention will become more apparent from the following detailed description of the present invention when taken in conjunction with the accompanying drawings.

DESCRIPTION OF EMBODIMENTS

Figure 1:
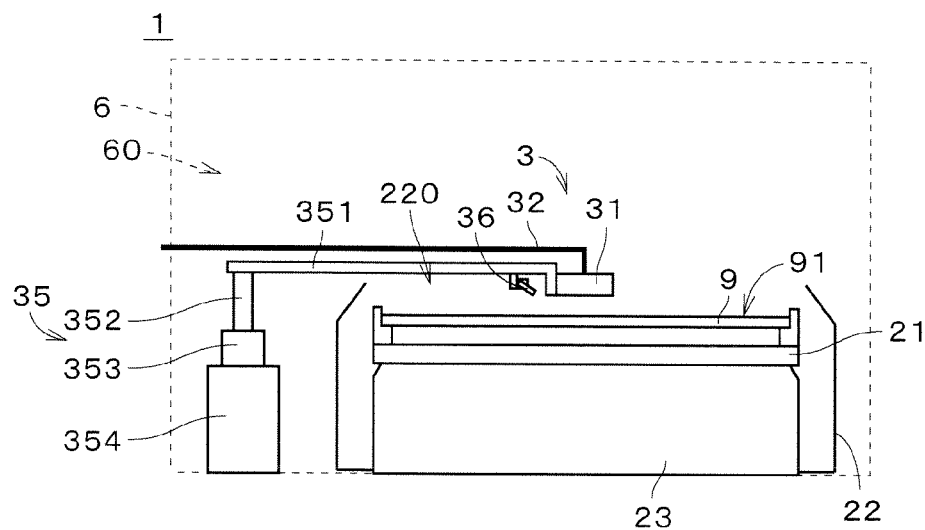
FIG. 1 is a front view of a substrate processing apparatus according to an embodiment of the present invention.
Figure 2A:
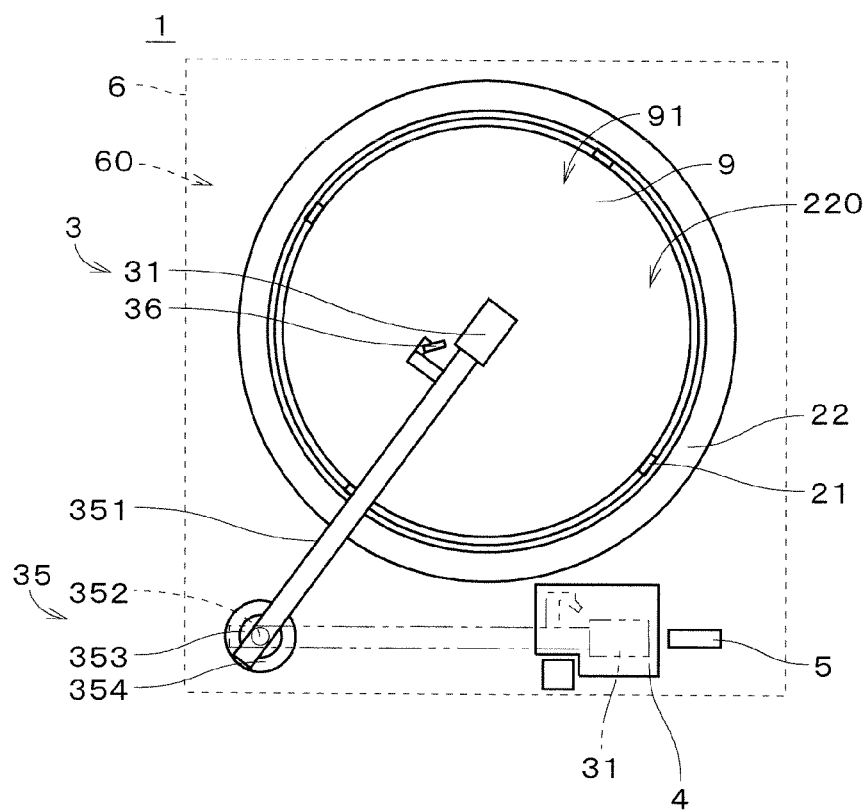
FIG. 2A is a plan view of the substrate processing apparatus.

FIG. 1 is a front view of a substrate processing apparatus 1 according to an embodiment of the present invention. FIG. 2A is a plan view of the substrate processing apparatus 1. An orientation of the substrate processing apparatus 1 in FIG. 2A is different from that in FIG. 1. The substrate processing apparatus 1 is a single-wafer processing apparatus for processing semiconductor substrates 9 (hereinafter, simply referred to as "substrates 9") one at a time. The substrate processing apparatus 1 performs predetermined processing by ejecting a processing liquid toward a substrate 9. In the present embodiment, cleaning processing for removing particles or the like from a substrate 9 is performed by ejecting droplets of a cleaning liquid serving as the processing liquid onto the substrate 9. The substrate processing apparatus 1 ejects, for example, a spray of droplets, each having a diameter of approximately 20 µm (micrometers), toward a substrate 9.

As shown in FIGS. 1 and 2A, the substrate processing apparatus 1 includes a substrate holding part 21, a cup part 22, a substrate rotation mechanism 23, a processing liquid supply part 3, a supply part movement mechanism 35, a protection liquid supply part 36, a standby pod 4, an ejection inspection part 5, a chamber 6, and a control unit, which will be described later. The chamber 6 houses constituent elements such as the substrate holding part 21, the cup part 22, the substrate rotation mechanism 23, the processing liquid supply part 3, the supply part movement mechanism 35, the protection liquid supply part 36, the standby pod 4, and the ejection inspection part 5 in its internal space 60. The chamber 6 is a light-tight chamber that prevents the entry of light into the internal space 60 from outside. In FIGS. 1 and 2A, the chamber 6 is indicated by a broken line and the interior of the chamber 6 is shown.

The substrate holding part 21 holds a substrate 9 with one main surface 91 (hereinafter, referred to as an "upper surface 91") of the substrate 9 facing upward inside the chamber 6. On the upper surface 91 of the substrate 9 is formed a fine pattern such as a circuit pattern. The cup part 22 is a substantially cylindrical member that surrounds the substrate 9 and the substrate holding part 21. The substrate rotation mechanism 23 is disposed under the substrate holding part 21. The substrate rotation mechanism 23 is configured to rotate the substrate 9 together with the substrate holding part 21 in a horizontal plane around a rotation axis that passes through the center of the substrate 9 and that is perpendicular to the upper surface 91 of the substrate 9.

The processing liquid supply part 3 includes an ejection head 31 for ejecting a processing liquid downward, and processing liquid piping 32 for supplying the processing liquid to the ejection head 31. The ejection head 31 is disposed above the substrate holding part 21 inside the cup part 22. In other words, a lower surface of the ejection head 31 is located between an upper opening 220 of the cup part 22 and the upper surface 91 of the substrate 9. The ejection head 31 is a device for continuously ejecting fine mutually separated droplets of liquid from a plurality of outlets, which will be described later. The ejection head 31 ejects a processing liquid toward the upper surface 91 of the substrate 9. Examples of the processing liquid include liquids such as pure water (preferably, deionized water (DIW)), carbonated water, and a mixture of aqueous ammonia and a hydrogen peroxide solution. A design ejection direction of the processing liquid from the ejection head 31 is substantially parallel to the vertical direction (i.e., the direction of gravity).

Figure 3:
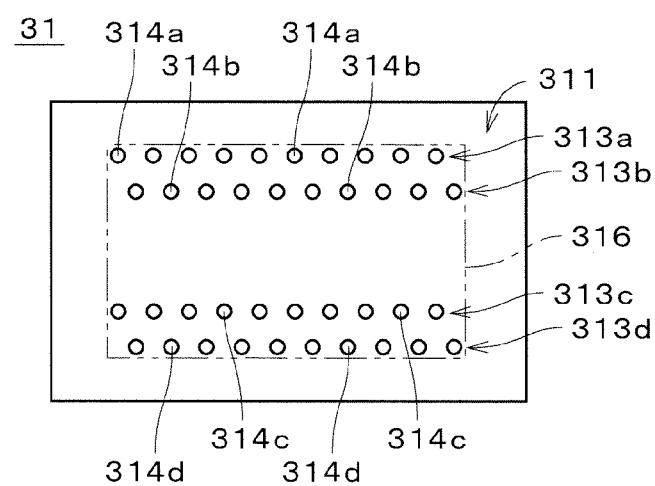
FIG. 3 is a bottom view showing the underside of the ejection head.

FIG. 3 is a bottom view showing the lower surface 311 of the ejection head 31. The lower surface 311 of the ejection head 31 is provided with a plurality of outlets that constitute four outlet rows 313a to 313d. The outlet rows 313a to 313d each have a plurality of outlets (314a to 314d, respectively) that are linearly arranged at a predetermined arrangement pitch in the lateral direction in FIG. 3. The outlets 314a to 314d each have a diameter of approximately 5 to 10 μm. FIG. 3 shows the outlets 314a to 314d larger than their actual size and shows a smaller number of outlets 314a to 314d than their actual number. In FIG. 3, an outlet arrangement area 316 where the outlets 314a to 314d are provided in the lower surface 311 of the ejection head 31 is enclosed by a dashed double-dotted line. The outlet arrangement area 316 is substantially rectangular in shape. The ejection head 31 ejects fine droplets of the processing liquid from each of the outlets 314a to 314d.

In the following description, the lateral direction in FIG. 3 is referred to as an "arrangement direction." The outlet rows 313a to 313d arranged in a direction from top to bottom in FIG. 3 are respectively referred to as a "first outlet row 313a," a "second outlet row 313b," a "third outlet row 313c," and a "fourth outlet row 313d." The outlets 314a in the first outlet row 313a are referred to as "first outlets 314a." the outlets 314b in the second outlet row 313b are referred to as "second outlets 314b," the outlets 314c in the third outlet row 313c are referred to as "third outlets 314c." and the outlets 314d in the fourth outlet row 313d are referred to as "fourth outlets 314d."

The first outlet row 313a, the second outlet row 313b, the third outlet row 313c, and the fourth outlet row 313d linearly extend in the arrangement direction and are disposed parallel to one another. In the direction perpendicular to the arrangement direction (i.e., in the vertical direction in FIG. 3), the distance between the first outlet row 313a and the second outlet row 313b is equal to the distance between the third outlet row 313c and the fourth outlet row 313d and is smaller than the distance between the second outlet row 313b and the third outlet row 313c. The second outlet row 313b is shifted a predetermined shift distance to the right in FIG. 3, which is one side of the arrangement direction, relative to the first outlet row 313a. The fourth outlet row 313d is shifted by the above shift distance to the right in FIG. 3 relative to the third outlet row 313c. The shift distance is a distance smaller than the aforementioned arrangement pitch and is, for example, half the arrangement pitch.

When the ejection head 31 is viewed from a direction that is perpendicular to the arrangement direction and parallel to the lower surface 311 of the ejection head 31, the first outlets 314a and the second outlets 314b are alternately arranged in the arrangement direction, and the third outlets 314c and the fourth outlets 314d are also alternately arranged in the arrangement direction. Also, the first outlets 314a and the third outlets 314c overlap one another, and the second outlets 314b and the fourth outlets 314d overlap one another.

As shown in FIGS. 1 and 2A, the supply part movement mechanism 35 includes an arm 351, a rotation shaft 352, a head rotation mechanism 353, and a head elevating mechanism 354. The arm 351 extends in a horizontal direction from the rotation shaft 352. The arm 351 has the ejection head 31 attached to its tip. The head rotation mechanism 353 is configured to rotate the ejection head 31 together with the arm 351 around the rotation shaft 352 in the horizontal direction. The head elevating mechanism 354 is configured to move the ejection head 31 together with the arm 351 in the vertical direction. The head rotation mechanism 353 includes, for example, an electric motor. The head elevating mechanism 354 includes, for example, a ball screw mechanism and an electric motor.

The protection liquid supply part 36 is directly or indirectly fixed to the ejection head 31 and ejects a protection liquid obliquely downwardly. In the example shown in FIGS. 1 and 2, the protection liquid supply part 36 is attached to the arm 351 and indirectly fixed to the ejection head 31. Examples of the protection liquid include liquids such as pure water (preferably, deionized water), carbonated water, and a mixture of aqueous ammonia and a hydrogen peroxide solution, similarly to the aforementioned processing liquid. The protection liquid may be a liquid of the same type as the processing liquid or may be a liquid of a different type. With the substrate processing apparatus 1, the protection liquid ejected in the form of a liquid column from the protection liquid supply part 36 toward the upper surface 91 of the substrate 9 spreads over the substrate 9 under the ejection head 31 and forms a film of the protection liquid (hereinafter, referred to as a "protection liquid film") having a predetermined thickness directly under the ejection head 31. The protection liquid supply part 36 is moved together with the ejection head 31 by the head rotation mechanism 353 and the head elevating mechanism 354.

Figure 4:
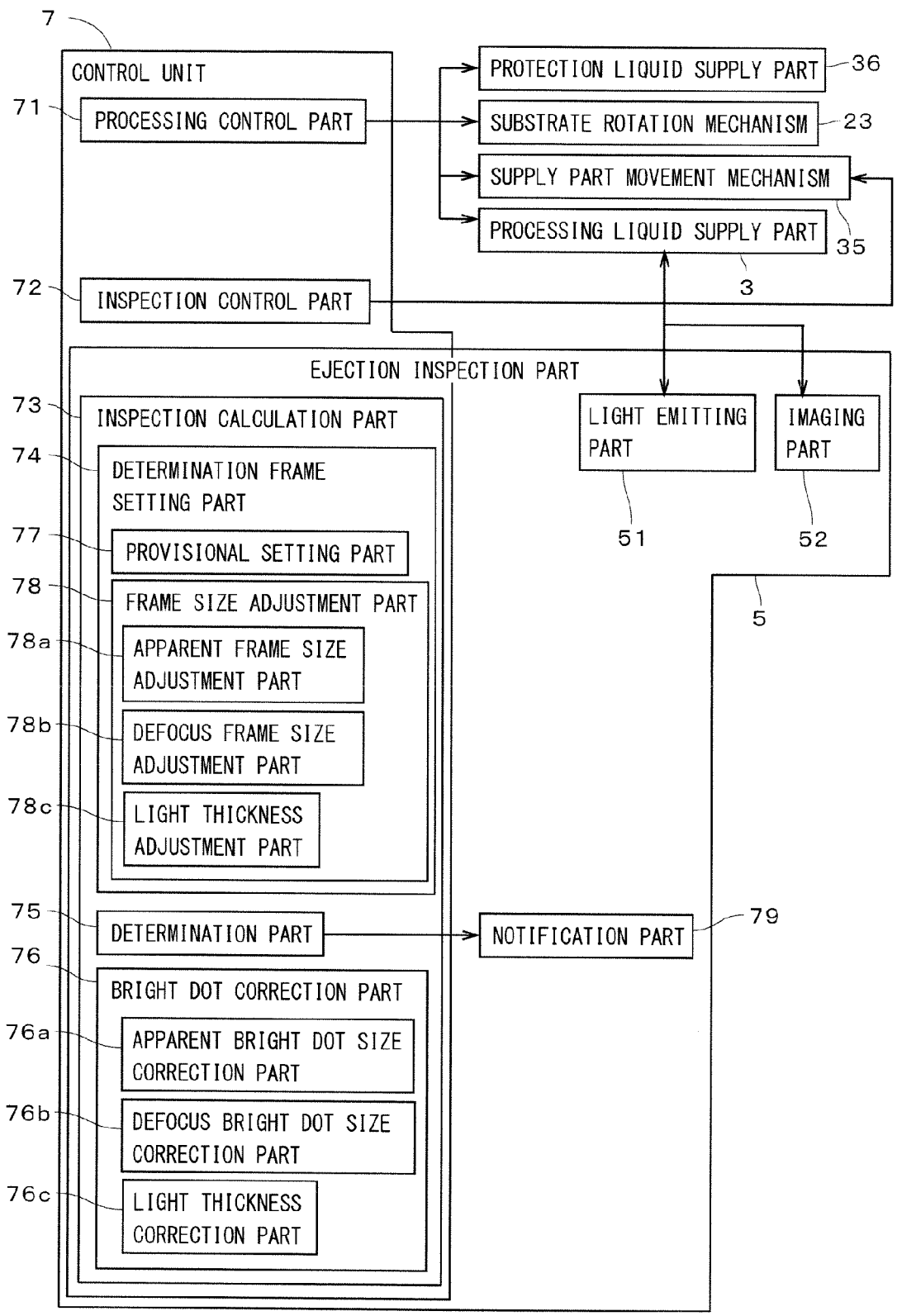
FIG. 4 is a block diagram showing functions of a control unit.

FIG. 4 is a block diagram showing functions of the control unit 7. FIG. 4 also shows constituent elements other than the control unit 7. The control unit 7 includes a processing control part 71, an inspection control part 72, and an inspection calculation part 73. By the processing control part 71 controlling, for example, the substrate rotation mechanism 23, the processing liquid supply part 3, the supply part movement mechanism 35, and the protection liquid supply part 36 processing is performed on a substrate 9. Also, by the inspection control part 72 controlling, for example, the processing liquid supply part 3, the supply part movement mechanism 35, and the ejection inspection part 5, the operation of ejecting the processing liquid from the outlets 314a to 314d of the ejection head 31 is inspected.

The inspection calculation part 73 constitutes part of the ejection inspection part 5 and includes a determination frame setting part 74, a determination part 75, and a bright dot correction part 76. The determination frame setting part 74 includes a provisional setting part 77 and a frame size adjustment part 78. The frame size adjustment part 78 includes an apparent frame size adjustment part 78a, a defocus frame size adjustment part 78b, and a light thickness adjustment part 78c. The bright dot correction part 76 includes an apparent bright dot size correction part 76a, a defocus bright dot size correction part 76b, and a light thickness correction part 76c. The determination frame setting part 74, the determination part 75, and the bright dot correction part 76 are used to inspect the above ejection operation.

The frame size adjustment part 78 appropriately combines and uses the apparent frame size adjustment part 78a, the defocus frame size adjustment part 78b, and the light thickness adjustment part 78c according to first to fourth adjustment methods, which will be described later. Similarly, the bright dot correction part 76 appropriately combines and uses the apparent bright dot size correction part 76a, the defocus bright dot size correction part 76b, and the light thickness correction part 76c according to the first to fourth adjustment methods.

Figure 2B:
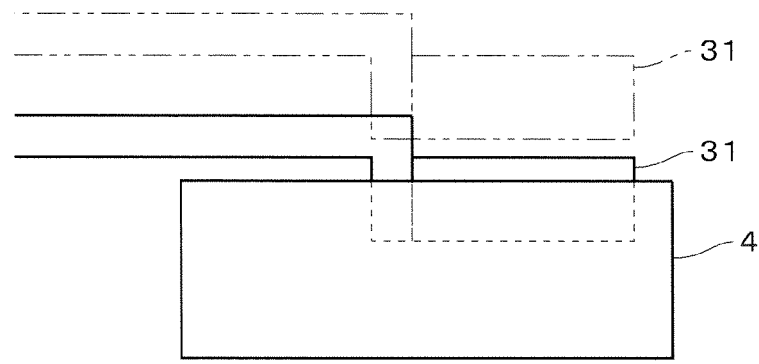
FIG. 2B is a side view of an ejection head and a standby pod.

When the substrate processing apparatus 1 shown in FIGS. 1 and 2A performs processing on a substrate 9, the substrate 9 is first transported into the chamber 6 and held by the substrate holding part 21. During transport of the substrate 9, the ejection head 31 waits at a standby position above the standby pod 4 provided outside the cup part 22, as indicated by the dashed double-dotted line in FIG. 2A. FIG. 2B is an enlarged side view of the ejection head 31 at the standby position and the standby pod 4. The standby pod 4 is a container that has a substantially rectangular parallelepiped shape and an opening at the top. At the standby position, a portion of the ejection head 31 is inserted through the opening into the standby pod 4. Note that, in FIG. 2B, the protection liquid supply part 36 is not shown and the ejection head 31 located at an inspection position, which will be described later, is indicated by the dashed double-dotted line. When the substrate 9 is held by the substrate holding part 21, the substrate rotation mechanism 23 is driven by the processing control part 71, and the rotation of the substrate 9 is started.

Next, the head rotation mechanism 353 and the head elevating mechanism 354 are driven by the processing control part 71 so that the ejection head 31 and the protection liquid supply part 36 are moved up from the standby position, then to above the cup part 22, and then down. Accordingly, the ejection head 31 and the protection liquid supply part 36 are moved through the upper opening 220 of the cup part 22 to the inside of the cup part 22 and to above the substrate holding part 21. Then, the protection liquid supply part 36 starts the supply of the protection liquid to the substrate 9, forming a protection liquid film that covers a portion of the upper surface 91 of the substrate 9. Also, the ejection head 31 starts the ejection of the processing liquid (i.e., a jet of fine droplets) from the outlets 314a to 314d to the upper surface 91 of the substrate 9 on which the protection liquid film has been formed. The protection liquid film covers a plurality of design landing points (i.e., landing points of fine droplets) of the processing liquid ejected from the outlets 314a to 314d on the substrate 9.

A large number of fine droplets ejected from the ejection head 31 toward the protection liquid film collide with the protection liquid film on the upper surface 91 of the substrate 9 and indirectly collide with the upper surface 91 of the substrate 9 via the protection liquid film. The impact of the collision of the fine droplets of the processing liquid causes extraneous materials such as particles adhering to the upper surface 91 of the substrate 9 to be removed from the substrate 9. In other words, the fine droplets of the processing liquid indirectly transfer kinetic energy (i.e., indirectly apply kinetic energy) to the substrate 9 via the protection liquid film, and with this kinetic energy, the processing for cleaning the upper surface 91 of the substrate 9 is performed.

Such indirect collision of fine droplets of the processing liquid with the substrate 9 via the protection liquid film prevents or reduces the possibility of damage to a pattern or the like formed on the upper surface 91 of the substrate 9 during the processing for cleaning the substrate 9, as compared with direct collision of fine droplets with the substrate 9. In addition, the protection liquid that covers the area where the cleaning processing is performed on the substrate 9 prevents or reduces the possibility that particles or the like once removed from the substrate 9 will again adhere to the upper surface 91 of the substrate 9.

In the substrate processing apparatus 1, in parallel with the ejection of the protection liquid and the processing liquid, the head rotation mechanism 353 turns the ejection head 31 and the protection liquid supply part 36. The ejection head 31 and the protection liquid supply part 36 repeat horizontal reciprocating motion between a position above the center portion of the rotating substrate 9 and a position above the outer edge of the substrate 9. As a result, the entire upper surface 91 of the substrate 9 is cleaned. The rotation of the substrate 9 causes the protection liquid and the processing liquid that have been supplied to the upper surface 91 of the substrate 9 to be dispersed from the edge of the substrate 9 to the outside. The protection liquid and the processing liquid that have been dispersed from the substrate 9 are received by the cup part 22 and either discarded or collected.

After the predetermined processing (i.e., processing for cleaning the substrate 9) using the processing liquid ejected from the ejection head 31 has ended, the ejection of the protection liquid and the processing liquid is stopped. The ejection head 31 and the protection liquid supply part 36 are moved up to a position above the upper opening 220 of the cup part 22 by the head elevating mechanism 354 and then moved to the inspection position (see FIG. 2B) above the standby pod 4 by the head rotation mechanism 353. The inspection position is a position above the aforementioned standby position. At the inspection position of the ejection head 31, the ejection inspection part 5 inspects the operation of ejecting the processing liquid from the outlets 314a to 314d of the ejection head 31, periodically or as necessary.

Figure 5:
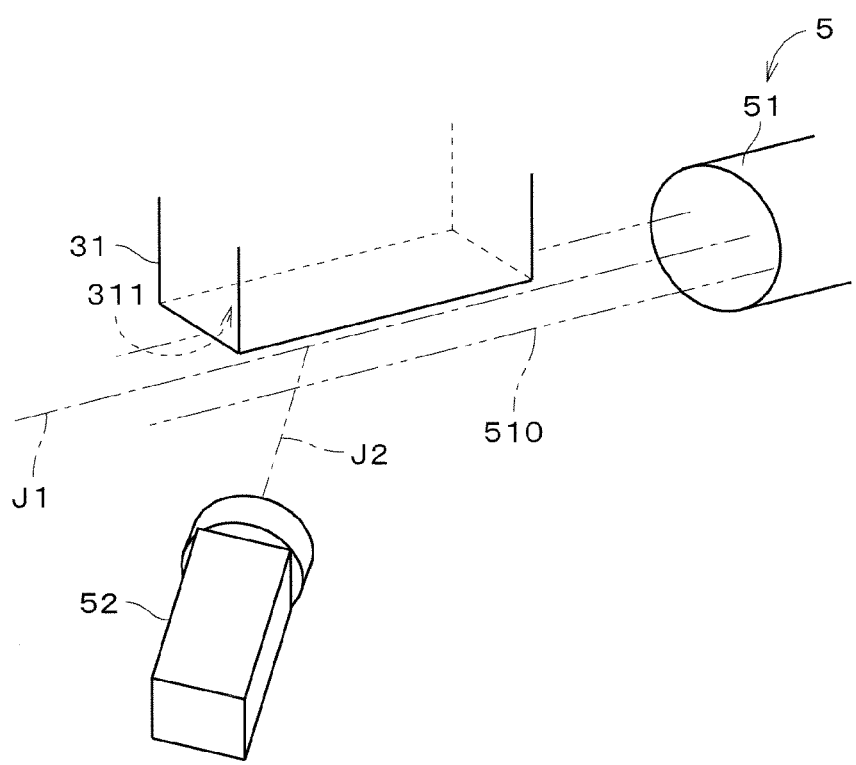
FIG. 5 is a perspective view of the ejection head, a light emitting part, and an imaging part.

FIG. 5 is a perspective view of the ejection head 31 at the inspection position and the ejection inspection part 5 disposed around the ejection head 31. The ejection inspection part 5 includes a light emitting part 51 and an imaging part 52. The light emitting part 51 and the imaging part 52 are disposed obliquely below the ejection head 31, avoiding directly under the ejection head 31. The light emitting part 51 and the imaging part 52 are controlled by the inspection control part 72 of the control unit 7 as shown in FIG. 4.

The light emitting part 51 shown in FIG. 5 includes a light source and an optical system for converting light emitted from the light source into linear light extending substantially in the horizontal direction. Examples of the light source include a laser diode and a light emitting diode (LED) element. The light emitting part 51 emits light toward the underside of the ejection head 31 along a light existing plane that is a predetermined virtual plane. In FIG. 5, an optical axis J1 of the light emitting part 51 is indicated by a dashed dotted line, and the outline of planar light emitted from the light emitting part 51 is indicated by dashed double-dotted lines denoted by 510.

The planar light 510 from the light emitting part 51 passes through directly under the ejection head 31 near the lower surface 311 of the ejection head 31. In the substrate processing apparatus 1, the inspection control part 72 sends a predetermined drive signal to the processing liquid supply part 3 so that the processing liquid is ejected toward the interior of the standby pod 4 from the outlets 314a to 314d (see FIG. 3) of the ejection head 31. Then, a plurality of flying droplets of the processing liquid ejected from the outlets 314a to 314d of the ejection head 31 are irradiated with the light emitted from the light emitting part 51 when passing through the aforementioned light existing plane (i.e., the planar light 510). The planar light 510 is substantially perpendicular to the design ejection direction of the processing liquid ejected from the ejection head 31 (i.e., a predetermined ejection direction of flying droplets). Strictly, it is preferable for the planar light 510 (i.e., the light existing plane) to be inclined at only a slight angle (e.g., 5 to 10 degrees) relative to a plane perpendicular to a predetermined ejection direction of flying droplets.

The imaging part 52 is disposed below the light existing plane such that its imaging axis J2 is directed to the planar light 510 located under the ejection head 31. The imaging direction of the imaging part 52 (i.e., the direction in which the imaging axis J2 is directed) inclines relative to the plane perpendicular to the predetermined ejection direction of flying droplets. One example of the imaging part 52 is a charge-coupled device (CCD) camera. The imaging part 52 captures an image of the processing liquid (i.e., a plurality of flying droplets) passing through the planar light 510 so as to acquire an inspection image that includes a plurality of bright dots appearing on the plurality of flying droplets. The ejection inspection part 5 extracts a single frame of still image as the inspection image from the result of the image capture by the imaging part 52. The imaging part 52 is disposed at a position from which the first outlet row 313a appears as the nearest row among the four outlet rows 313a to 313d in FIG. 3.

Figure 6:
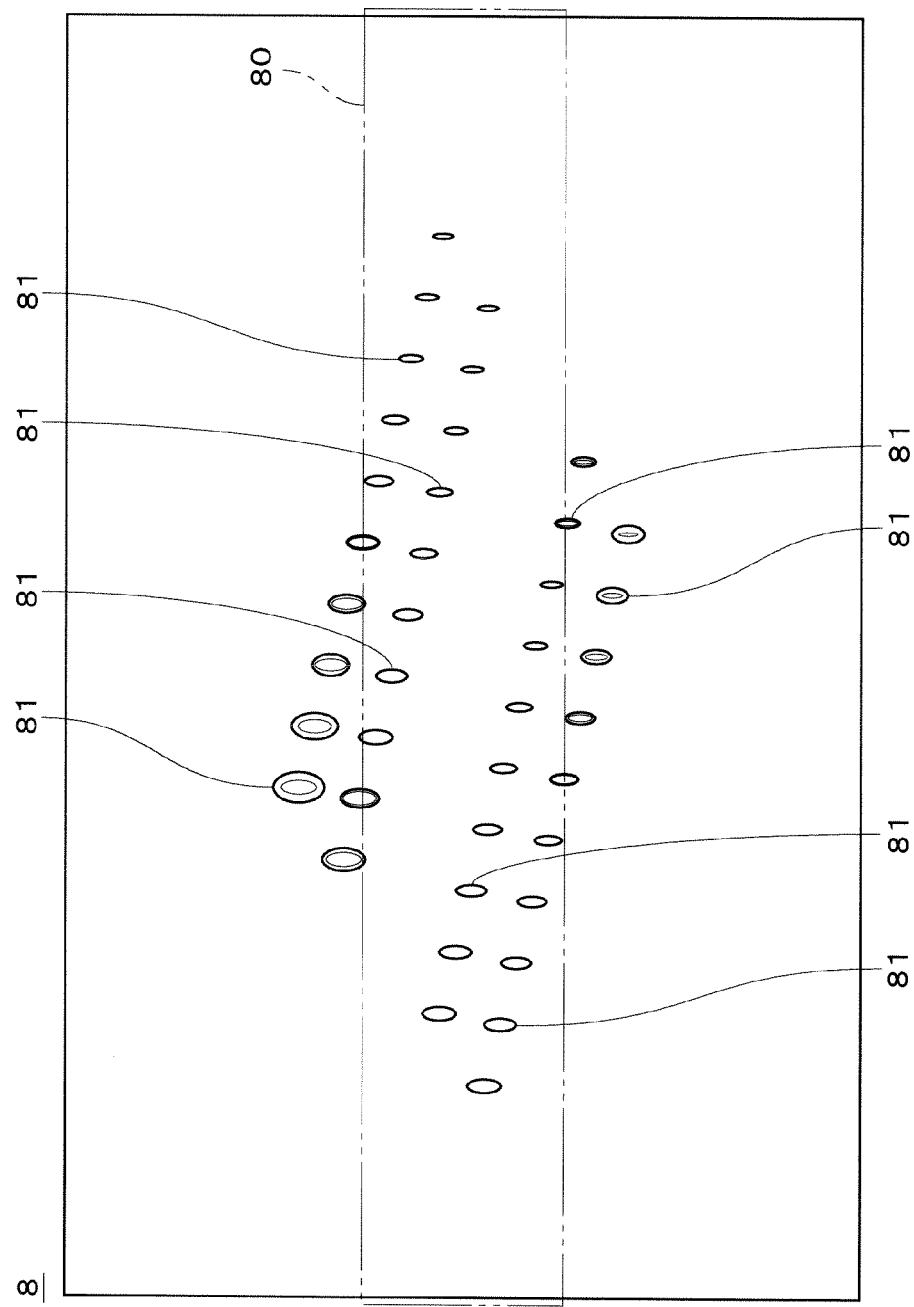
FIGS. 6 and 7 illustrate an inspection image.

FIG. 6 illustrates an inspection image 8. In the inspection image 8, a plurality of bright dots 81 that correspond respectively to the plurality of outlets 314a to 314d of the ejection head 31 are arranged in a direction corresponding to the arrangement direction of the outlets 314a to 314d. In the ejection inspection part 5, since the planar light 510 does have a slight thickness, each of the bright dots 81 has a substantially ellipsoidal shape that is long in a direction corresponding to the vertical direction in the inspection image 8. As will be described later, some of the bright dots 81 are located outside an in-focus range of the imaging part 52 and accordingly are blurred (i.e., out of focus) and enlarged more than the other bright dots 81 in the inspection image 8. In FIG. 6, the in-focus range is indicated by a dashed double-dotted line denoted by 80. Also, the thin line within each of the bright dots 81 located outside the in-focus range 80 indicates the size of the bright dot if it was located within the in-focus range 80. The same applies to FIGS. 7, 10, and 12 to 16.

The output from the imaging part 52 is transmitted to the inspection calculation part 73 of the control unit 7 (see FIG. 4). The inspection calculation part 73 performs binary processing on the inspection image 8 so as to extract the bright dots 81 and remove background noise or the like.

Figure 7:
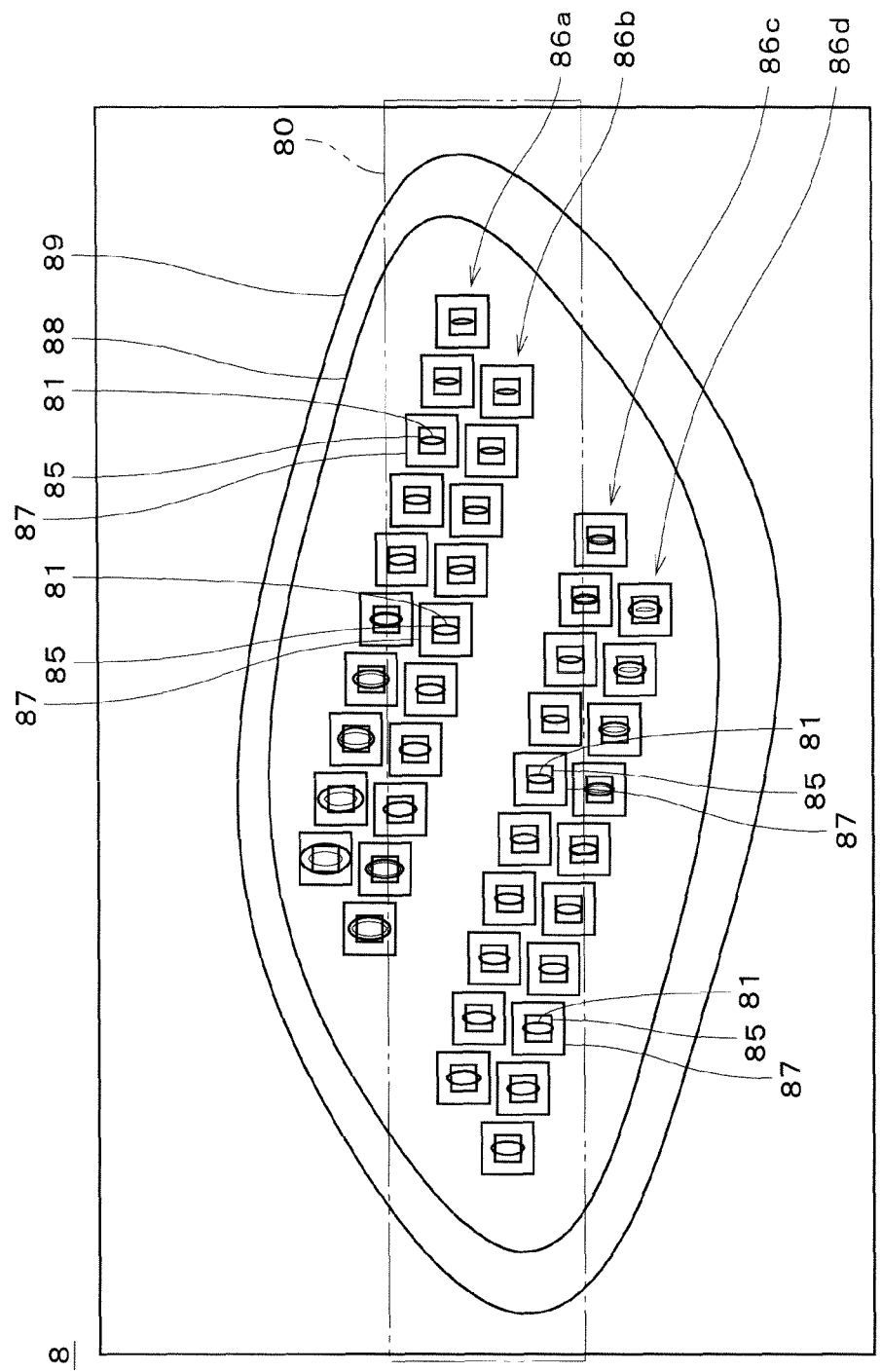

Then, as shown in FIG. 7, the determination frame setting part 74 (see FIG. 4) sets a plurality of normal ejection determination frames 85 that correspond respectively to the plurality of outlets 314a to 314d in the inspection image 8. The number of normal ejection determination frames 85 is equal to the number of outlets 314a to 314d. The normal ejection determination frames 85 each have a substantially rectangular shape of a predetermined size and all have the same size in the inspection image 8. In the present embodiment, the normal ejection determination frames 85 are each substantially in the shape of a square whose four sides are parallel to either the vertical direction or the lateral direction in the inspection image 8. Each of the normal ejection determination frames 85 indicates an area of the planar light 510 through which the processing liquid passes when ejected in a predetermined ejection direction from the corresponding outlet or in a direction slightly deviating from the predetermined ejection direction by a permissible amount of deviation.

The normal ejection determination frames 85 are arranged in a direction corresponding to the aforementioned arrangement direction in the inspection image 8. In the following description, rows of the normal ejection determination frames 85 corresponding respectively to the first outlet row 313a, the second outlet row 313b, the third outlet row 313c, and the fourth outlet row 313d are respectively referred to as a "first normal ejection determination frame row 86a," a "second normal ejection determination frame row 86b," a "third normal ejection determination frame row 86c," and a "fourth normal ejection determination frame row 86d."

The position of each of the normal ejection determination frames 85 in the inspection image 8 is determined on the basis of a bright dot reference position of the processing liquid ejected from the outlet corresponding to the normal ejection determination frame 85. The bright dot reference position is a point at which an ejection center line extending from each outlet in the design ejection direction of the processing liquid intersects with the planar light 510 (i.e., the aforementioned light existing plane). Each of the normal ejection determination frames 85 is set centering on a corresponding one of bright dot reference positions in the inspection image 8.

The bright dot reference positions in the inspection image 8 can be obtained using various methods. For example, the coordinates of each bright dot reference position in a three-dimensional coordinate system set by the substrate processing apparatus 1 are obtained on the basis of a design position and orientation of the ejection head 31 at the inspection position, the position of a corresponding one of the outlets 314a to 314d of the ejection head 31, the design ejection direction of the processing liquid, the position of the planar light 510, and the position of the imaging part 52. In other words, the coordinates of the bright dot reference positions are obtained on the basis of the relative positions of the ejection head 31, the light emitting part 51, and the imaging part 52.

Then, the coordinates of the bright dot reference positions are transformed to view coordinates using a view coordinate transformation matrix so as to obtain the coordinates of the bright dot reference position in the three-dimensional coordinate system whose origin is the imaging part 52. The view coordinates of the bright dot reference positions obtained by the view coordinate transformation are then subjected to perspective projection transformation so as to acquire the coordinates of the bright dot reference positions in a two-dimensional coordinate system of the inspection image 8. Note that the substrate processing apparatus 1 performs perspective projection transformation as described above because the imaging part 52 uses a non-telecentric optical system, but if the imaging part 52 uses a telecentric optical system, the coordinates of the bright dot reference positions in the inspection image 8 can be obtained through orthogonal projection (also called "parallel projection") of the view coordinates of the bright dot reference positions obtained by the view coordinate transformation.

As shown in FIG. 7, the normal ejection determination frames 85 are arranged in the inspection image 8 without overlapping one another. If the normal ejection determination frames 85 overlap one another in the inspection image 8, the setting of the normal ejection determination frames 85 is repeated while changing the position and orientation of the imaging part 52, the position and orientation of the planar light 510 emitted from the light emitting part 51, or the like until the normal ejection determination frames 85 no longer overlap one another.

After the setting of the normal ejection determination frames 85 has ended, the determination frame setting part 74 sets a plurality of oblique ejection determination frames 87 respectively around the plurality of normal ejection determination frames 85. The oblique ejection determination frames 87 are determination frames each having a substantially rectangular outline greater than that of the normal ejection determination frames 85. The oblique ejection determination frames 87 each include one normal ejection determination frame 85. The positions of the substantially rectangular oblique ejection determination frames 87 are set on the basis of the positions of their corresponding normal ejection determination frames 85. Specifically, each of the oblique ejection determination frames 87 is disposed to surround the corresponding normal ejection determination frame 85 so that the normal ejection determination frame 85 is located substantially at the center of the oblique ejection determination frame 87. The number of normal ejection determination frames 85 is equal to the number of oblique ejection determination frames 87. Each of the oblique ejection determination frames 87 indicates an area of the planar light 510 through which the processing liquid passes when ejected in a direction deviating to some degree from the predetermined ejection direction.

After the setting of the oblique ejection determination frames 87 has ended, the determination frame setting part 74 sets a single protection-liquid-film ejection determination frame 88 that corresponds to the protection liquid film on the substrate 9 around the oblique ejection determination frames 87 in the inspection image 8. The protection-liquid-film ejection determination frame 88 indicates an area of the planar light 510 through which the processing liquid ejected from a plurality of outlets (hereinafter, referred to as "peripheral outlets") disposed in the peripheral portion of the outlet arrangement area 316 (see FIG. 3) passes when landing on the protection liquid film on the substrate 9. The protection-liquid-film ejection determination frame 88 is set on the basis of the positions of the peripheral outlets, the position of the peripheral portion of the protection liquid film on the substrate 9, and the position of the light existing plane located between the peripheral outlets and the protection liquid film.

Figure 8:
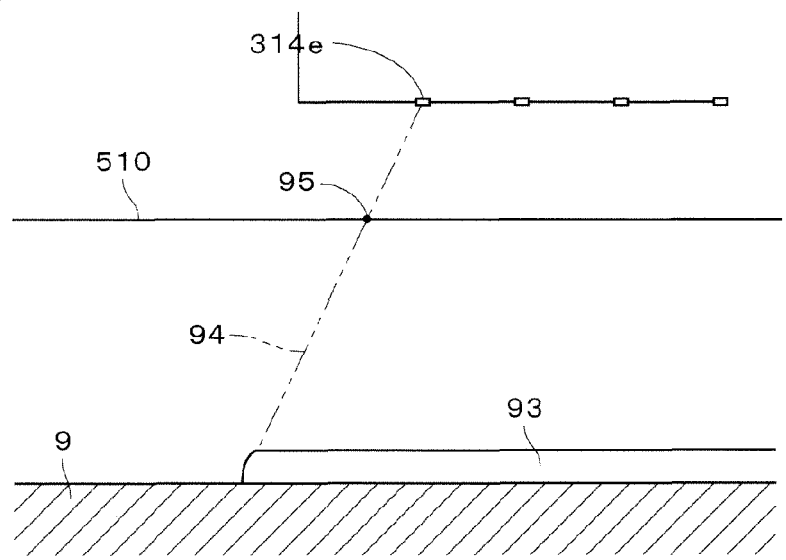
FIG. 8 is a conceptual diagram showing a portion of the ejection head, planar light, and a protection liquid film.

Specifically, as shown in FIG. 8, a virtual line 94 is drawn from one peripheral outlet 314e to a point that is on the peripheral portion (more specifically, the outer edge) of the protection liquid film 93 on the substrate 9 and that is closest to the peripheral outlet 314e, and an intersection point 95 of the virtual line 94 and the light existing plane (i.e., planar light 510) is obtained. Then, such an intersection point 95 on the planar light 510 is obtained for each of a plurality of peripheral outlets 314e, and the obtained intersection points 95 are projected onto the inspection image 8 and connected in order. This produces the protection-liquid-film ejection determination frame 88 shown in FIG. 7.

After the setting of the protection-liquid-film ejection determination frame 88 has ended, the determination frame setting part 74 sets a single maximum ejection determination frame 89 that surrounds the protection-liquid-film ejection determination frame 88 in the inspection image 8. The maximum ejection determination frame 89 is an outer ejection determination frame that is substantially rectangular in shape and is located at the outermost position among all of the ejection determination frames. The maximum ejection determination frame 89 corresponds to a maximum range in which the processing liquid ejected from the ejection head 31 will possibly land on the substrate 9. The maximum ejection determination frame 89 is set on the basis of the position of the peripheral portion of the maximum range, the positions of the peripheral outlets 314e, and the position of the light existing plane, similarly to the protection-liquid-film ejection determination frame 88. Note that the order in which the normal ejection determination frames 85, the oblique ejection determination frames 87, the protection-liquid-film ejection determination frame 88, and the maximum ejection determination frame 89 are set may be appropriately changed.

After the setting of the ejection determination frames (namely, the normal ejection determination frames 85, the oblique ejection determination frames 87, the protection-liquid-film ejection determination frame 88, and the maximum ejection determination frame 89) has ended, the determination part 75 acquires existence information on bright dots 81 in the respective ejection determination frames, i.e., information indicating whether or not a bright dot 81 exists in each of the ejection determination frames. The determination part 75 is configured to determine that a bright dot 81 exists in an ejection determination frame if at least a portion of the bright dot 81 is located within the ejection determination frame. If a bright dot 81 spans two ejection determination frames, namely, an inner ejection determination frame and an outer ejection determination frame, the determination part 75 determines that the bright dot 81 exists in the inner ejection determination frame but does not exist in the outer ejection determination frame. For example, if a bright dot 81 spans a normal ejection determination frame 85 and an oblique ejection determination frame 87, the determination part 75 determines that the bright dot 81 exists not in the oblique ejection determination frame 87 but in the normal ejection determination frame 85. On the other hand, if at least a portion of a bright dot 81 exists in the area of an oblique ejection determination frame 87 other than the area of the normal ejection determination frame 85 and the entire bright dot 81 is located outside the normal ejection determination frame 85, the determination part 75 determines that the bright dot 81 exists in the oblique ejection determination frame 87. The same rule applies to determining the existence or non-existence of a bright dot 81 in the protection-liquid-film ejection determination frame 88 and the maximum ejection determination frame 89.

At the time of acquiring the existence information on bright dots 81, the determination part 75 first acquires existence information on bright dots 81 in the respective normal ejection determination frames 85. Specifically, one of the bright dots 81 is detected as a bright dot of interest in the inspection image 8. Then, a normal ejection determination frame 85 and an oblique ejection determination frame 87 that are located at a position closest to the bright dot of interest are extracted as the normal ejection determination frame 85 and the oblique ejection determination frame 87 corresponding to the bright dot of interest.

Then, the position of the bright dot of interest is compared with the position of the extracted normal ejection determination frame 85 and the position of the extracted oblique ejection determination frame 87 so as to determine whether or not the bright dot of interest exists in the normal ejection determination frame 85 and whether or not the bright dot of interest exists in the oblique ejection determination frame 87. As described above, the determination part 75 determines that the bright dot of interest exists in the normal ejection determination frame 85 if at least a portion of the bright dot of interest is located within the normal ejection determination frame 85. If the entire bright dot of interest is located outside the normal ejection determination frame 85 and at least a portion of the bright dot of interest is located within the oblique ejection determination frame 87, the determination part 75 determines that the bright dot of interest exists in the oblique ejection determination frame 87.

On the other hand, if it has been determined that the bright dot of interest exists in neither the normal ejection determination frame 85 nor the oblique ejection determination frame 87, the position of the bright dot of interest is compared with the position of the protection-liquid-film ejection determination frame 88 so as to determine whether or not the bright dot of interest exists in the protection-liquid-film ejection determination frame 88. If at least a portion of the bright dot of interest is located within the protection-liquid-film ejection determination frame 88, it is determined that the bright dot of interest exists in the protection-liquid-film ejection determination frame 88. If it has been determined that the bright dot of interest does not exist in the protection-liquid-film ejection determination frame 88, the position of the bright dot of interest is compared with the position of the maximum ejection determination frame 89 so as to determine whether or not the bright dot of interest exists in the maximum ejection determination frame 89. If at least a portion of the bright dot of interest is located within the maximum ejection determination frame 89, it is determined that the bright dot of interest exists in the maximum ejection determination frame 89.

When determining the existence or non-existence of a bright dot 81, the determination part 75 excludes the area of the inspection image 8 outside the maximum ejection determination frame 89 from target areas used for the detection of bright dots. Accordingly, the maximum ejection determination frame 89 functions as a bright dot detection mask for masking the area outside the maximum ejection determination frame 89. This shortens the time required for the determination part 75 to detect bright dots and accordingly shortens the time required for the ejection inspection part 5 to determine the quality of the ejection operations.

In the inspection calculation part 73, the determination part 75 determines the quality of the ejection operations of the outlets 314a to 314d, which correspond respectively to the normal ejection determination frames 85, on the basis of the aforementioned existence information on bright dots 81 in the respective normal ejection determination frames 85, in the respective oblique ejection determination frames 87, in the protection-liquid-film ejection determination frame 88, and in the maximum ejection determination frame 89. Specific examples of determining the quality of the ejection operations will be described below with reference to FIGS. 9A to 9E.

FIGS. 9A to 9E conceptually illustrate a portion of the inspection image 8. FIGS. 9A to 9E show some of the normal ejection determination frames 85 in the first normal ejection determination frame row 86a, oblique ejection determination frames 87 corresponding to these normal ejection determination frames 85, a portion of the protection-liquid-film ejection determination frame 88, a portion of the maximum ejection determination frame 89, and bright dots 81. The same applies to FIGS. 11A to 11E, which will be described later.

Figure 9A:
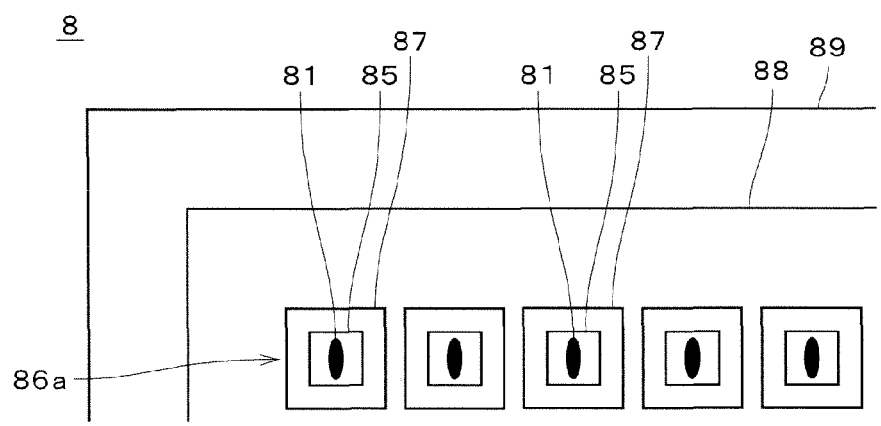
FIGS. 9A to 9E illustrate a portion of an inspection image.

In the case of FIG. 9A, the determination part 75 acquires, as the existence information on bright dots 81, information indicating that there is one bright dot 81 in each of the five normal ejection determination frames 85 and information indicating that there are no bright dots 81 in areas outside the normal ejection determination frames 85. The determination part 75 determines, on the basis of this existence information, that the ejection operations of the five first outlets 314a corresponding respectively to the five normal ejection determination frames 85 are satisfactory (i.e., normal).

Figure 9B:
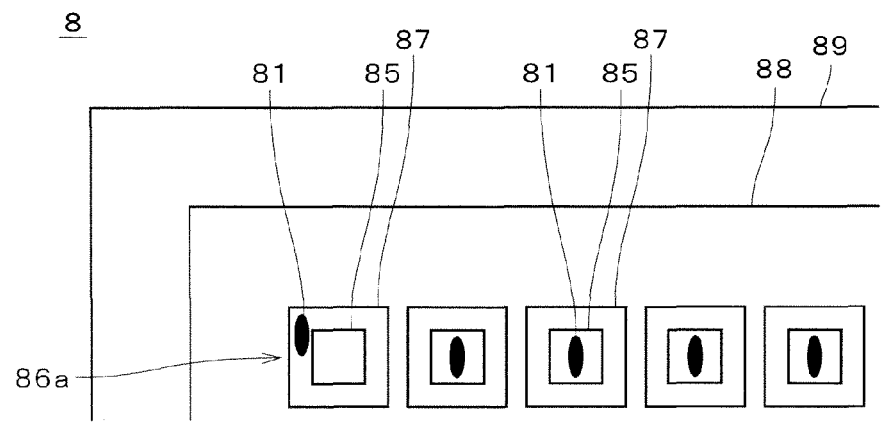

In the case of FIG. 9B, the determination part 75 acquires, as the existence information on bright dots 81, information indicating that there is no bright dot 81 in the first normal ejection determination frame 85 from the left in FIG. 9B, but there is one bright dot 81 in each of the other four normal ejection determination frames 85, and information indicating that there is one bright dot 81 in the first oblique ejection determination frame 87 from the left. The determination part 75 also acquires, as the existence information on bright dots 81, information indicating that there are no bright dots 81 in the protection-liquid-film ejection determination frame 88 and the maximum ejection determination frame 89.

The determination part 75 determines, on the basis of the above existence information, that the ejection operations of the four first outlets 314a that correspond respectively to the second to fifth normal ejection determination frames 85 from the left are satisfactory. As for the first outlet 314a corresponding to the first normal ejection determination frame 85 from the left, the determination part 85 determines that an ejection failure has occurred where the processing liquid was ejected in a direction deviating from the normal ejection range (so-called "oblique ejection"), because the bright dot 81 corresponding to this first outlet 314a exists in the oblique ejection determination frame 87. The occurrence of the ejection failure is notified to an operator or the like by the determination part 75 via a notification part 79 (see FIG. 4) such as a monitor of the ejection inspection part 5. Then, maintenance of the ejection head 31 such as cleaning the outlets 314a is performed before subsequent processing is performed on the substrate 9.

Figure 9C:
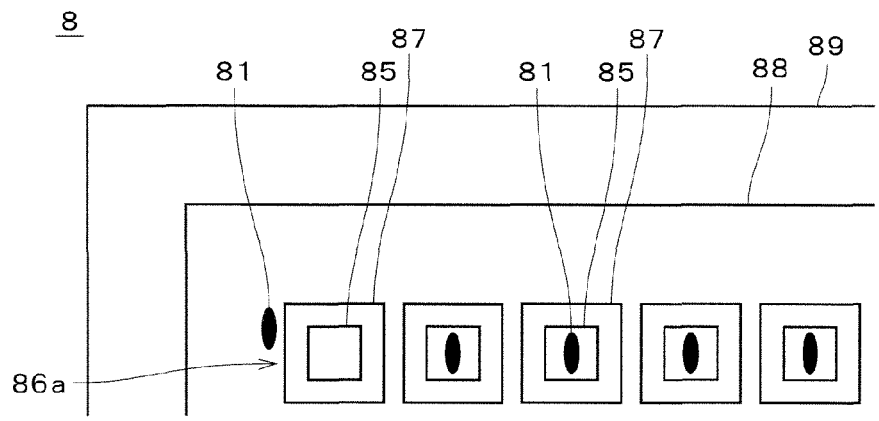

In the case of FIG. 9C, the determination part 75 acquires, as the existence information on bright dots 81, information indicating that there is no bright dot 81 in the first normal ejection determination frame 85 or the first oblique ejection determination frame 87 from the left, but there is one bright dot 81 in each of the other four normal ejection determination frames 85, and information indicating that there is one bright dot 81 in the protection-liquid-film ejection determination frame 88. The determination part 75 determines, on the basis of the acquired existence information, that the ejection operations of the four first outlets 314a corresponding respectively to the second to fifth normal ejection determination frames 85 from the left are satisfactory.

As for the first outlet 314a that corresponds to the first normal ejection determination frame 85 and the first oblique ejection determination frame 87 from the left, the determination part 75 determines that an ejection failure has occurred where the processing liquid was ejected very obliquely in a direction deviating from the range of oblique ejection corresponding to the oblique ejection determination frame 87, because there is no bright dot 81 in the first normal ejection determination frame 85 or the first oblique ejection determination frame 87 from the left, but there is a bright dot 81 near the first oblique ejection determination frame 87 within the protection-liquid-film ejection determination frame 88. It is also determined that the processing liquid ejected from that first outlet 314a toward the substrate 9 will land on the protection liquid film 93. The occurrence of the ejection failure is notified to an operator or the like by the determination part 75 via the notification part 79, and maintenance of the ejection head 31 is performed.

Note that the determination part 75 does not necessarily have to identify the outlet that corresponds to the bright dot 81 in the protection-liquid-film ejection determination frame 88. In this case, as for the first outlet 314a that is positioned first on the left, the determination part 75 determines that an ejection failure of either very oblique ejection to the area outside the range corresponding to the oblique ejection determination frame 87 or no ejection due to a clogged outlet has occurred. The determination part 75 also determines that very oblique ejection where the processing liquid lands on the protection liquid film 93 outside the area corresponding to the oblique ejection determination frame 87 has occurred in one of the first outlet 314a that is positioned first on the left and other outlets 314a to 314d not shown.

Figure 9D:
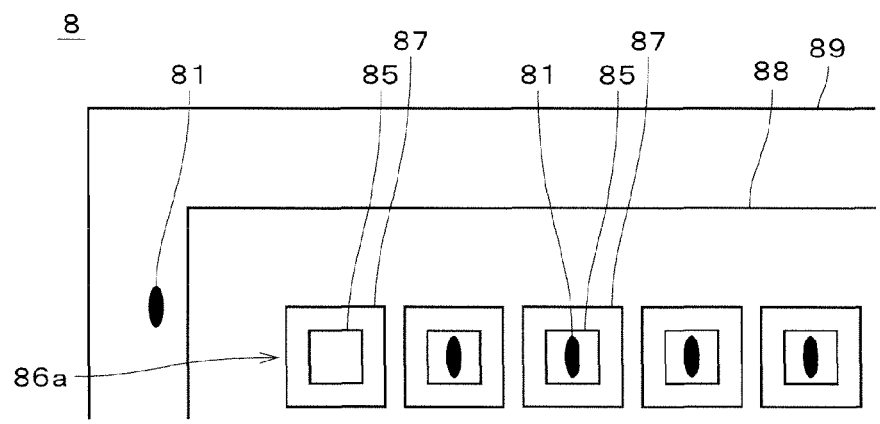

In the case of FIG. 9D, the determination part 75 acquires, as the existence information on bright dots 81, information indicating that there is no bright dot 81 in the first normal ejection determination frame 85 or the first oblique ejection determination frame 87 from the left, but there is one bright dot 81 in each of the other four normal ejection determination frames 85, information indicating that there is no bright dot 81 in the protection-liquid-film ejection determination frame 88, and information indicating that there is one bright dot 81 in the maximum ejection determination frame 89. The determination part 75 determines, on the basis of the existence information, that the ejection operations of the four first outlets 314a that correspond respectively to the second to fifth normal ejection determination frames 85 from the left are satisfactory.

As for the first outlet 314a that corresponds to the first normal ejection determination frame 85 from the left, as described above, there is no bright dot 81 in the normal ejection determination frame 85 or the oblique ejection determination frame 87 that correspond to this first outlet 314a and there is no bright dot 81 in the protection-liquid-film ejection determination frame 88, but there is a bright dot 81 in the maximum ejection determination frame 89. Therefore, it is determined that the processing liquid is ejected in a direction deviating considerably from the predetermined ejection direction and will land on the area outside the protection liquid film 93 when ejected onto the substrate 9. The occurrence of the ejection failure is notified to an operator or the like by the determination part 75 via the notification part 79 such as a monitor of the ejection inspection part 5. The landing of the processing liquid on the area outside the protection liquid film 93 on the substrate 9 raises the possibility of damage to the pattern on the substrate 9. Thus, the ejection head 31 will be, for example, disassembled for maintenance or replaced with another ejection head 31.

Note that the determination part 75 does not necessarily have to identify the outlet that corresponds to the bright dot 81 in the maximum ejection determination frame 89. In this case, as for the first outlet 314a that is positioned first on the left, the determination part 75 determines that an ejection failure of either no ejection or extremely oblique ejection to the area outside the protection liquid film 93 has occurred. The determination part 75 also determines that extremely oblique ejection to the area outside the protection liquid film 93 has occurred in one of the first outlet 314a that is positioned first on the left and other outlets 314a to 314d not shown.

Figure 9E:
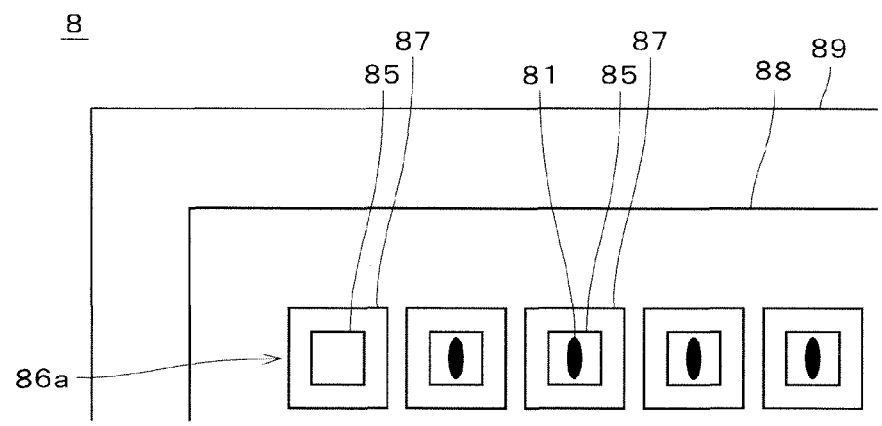

In the case of FIG. 9E, the determination part 75 acquires, as the existence information on bright dots 81, information indicating that there is no bright dot 81 in the first normal ejection determination frame 85 or the first oblique ejection determination frame 87 from the left, but there is one bright dot 81 in each of the other four normal ejection determination frames 85, and information indicating that there is no bright dot 81 in the protection-liquid-film ejection determination frame 88 or the maximum ejection determination frame 89. The determination part 75 determines, on the basis of the existence information, that the ejection operations of the four first outlets 314a that correspond respectively to the second to fifth normal ejection determination frames 85 from the left are satisfactory. The determination part 75 also determines that an ejection failure of no ejection where the processing liquid was not ejected has occurred in the first outlet 314a that correspond to the first normal ejection determination frame 85 from the left.

Incidentally, as an example of the ejection inspection part for determining the quality of the ejection operations of a plurality of outlets, it is conceivable to acquire an inspection image similar to that described above and measure the intervals in the arrangement direction between a plurality of bright dots in the inspection image. Such an ejection inspection part (hereinafter, referred to as a "comparative exemplary ejection inspection part") determines that, if the intervals between the bright dots are approximately equal to a predetermined interval, the ejection operations of the respective outlets are satisfactory. On the other hand, if the interval between a pair of adjacent bright dots is two or more times greater than the predetermined interval, it is determined that an outlet that is not ejecting the processing liquid is located between the two outlets corresponding to the two bright dots.

If the interval between a pair of adjacent bright dots is to a certain degree greater (or smaller) than the predetermined interval, the comparative exemplary ejection inspection part determines that an ejection failure of oblique ejection has occurred in one or both of the two outlets corresponding to the two bright dots. It is, however, not easy to determine which of the two outlets is causing an ejection failure. Also, if the direction in which the processing liquid is ejected from one of the outlets deviates away from the other outlet and the direction in which the processing liquid is ejected from the other outlet deviates away from the one outlet, at least one of the two outlets will be mistakenly determined as causing an ejection failure as described above, even if the deviation in the direction in which the processing liquid is ejected from the outlets is tolerable. In addition, if a plurality of consecutive outlets are causing ejection failures and a plurality of bright dots that correspond respectively to these outlets are all shifted in the same direction by substantially the same distance, the intervals between the bright dots will be approximately equal to the predetermined interval, and therefore, the ejection failures of the consecutive outlets will not be detected.

In contrast, in the ejection inspection part 5 of the substrate processing apparatus 1, the determination frame setting part 74 sets the normal ejection determination frames 85 corresponding respectively to the outlets 314a to 314d in the inspection image 8. Then, the determination part 75 acquires existence information indicating existence or non-existence of bright dots 81 in the respective normal ejection determination frames 85 and determines, on the basis of the existence information, the quality of the ejection operations of the outlets 314a to 314d corresponding respectively to the normal ejection determination frames 85. Accordingly, it is possible to determine the quality of the ejection operation of each of the outlets 314a to 314d accurately and individually (i.e., independently of determining the quality of the ejection operations of other outlets 314a to 314d).

In the ejection inspection part 5, the determination frame setting part 74 also sets the oblique ejection determination frames 87 corresponding respectively to the outlets 314a to 314d in the inspection image 8. Then, the determination part 75 acquires existence information indicating the existence or no-existence of bright dots 81 in the respective oblique ejection determination frames 87 and determines, on the basis of the existence information, whether or not oblique ejection has occurred in each of the outlets 314a to 314d corresponding respectively to the oblique ejection determination frames 87. Accordingly, it is possible to accurately and individually determine whether or not oblique ejection has occurred in the outlets 314a to 314d, to be more specific, whether or not there is slight oblique ejection to the areas corresponding to the oblique ejection determination frames 87.

In the ejection inspection part 5, the determination frame setting part 74 further sets the protection-liquid-film ejection determination frame 88 corresponding to the protection liquid film 93 in the inspection image 8. Then, the determination part 75 acquires existence information indicating the existence or non-existence of bright dots 81 in the protection-liquid-film ejection determination frame 88 and detects, on the basis of the existence information, whether or not there is extremely oblique ejection to the area that is outside the areas corresponding to the oblique ejection determination frames 87 and is where the protection liquid film 93 is formed. Accordingly, it is possible to accurately detect the occurrence of extremely oblique ejection.

Note that if the thickness of the peripheral portion of the protection liquid film 93 on the substrate 9 is smaller than a predetermined thickness, a peripheral portion of the protection liquid film 93 to be used as a reference when setting the aforementioned protection-liquid-film ejection determination frame 88 may be the outer edge of a portion of the protection liquid film 93 that has the predetermined thickness. In this case, it is possible to determine whether the processing liquid ejected in a direction deviating considerably from the ejection direction has landed on the portion of the protection liquid film 93 having the predetermined thickness or has landed on the area outside that portion.

In the ejection inspection part 5, the determination frame setting part 74 also sets the maximum ejection determination frame 89 that surrounds the protection-liquid-film ejection determination frame 88 in the inspection image 8. Then, the determination part 75 acquires existence information indicating the existence or non-existence of bright dots 81 in the maximum ejection determination frame 89 and detects, on the basis of the existence information, extremely oblique ejection to the area outside the area where the protection liquid film 93 is formed. Accordingly, it is possible to accurately detect the occurrence of an oblique ejection where the processing liquid lands on the area outside the protection liquid film 93.

In the ejection inspection part 5, the imaging direction of the imaging part 52 inclines relative to a plane perpendicular to the predetermined ejection direction of the processing liquid from the ejection head 31. This reduces the possibility of the bright dots 81 overlapping one another in the inspection image 8. This also reduces the possibility of the normal ejection determination frames 85 overlapping one another in the inspection image 8 and the possibility of the oblique ejection determination frames 87 overlapping one another in the inspection image 8. As a result, it is possible to improve the accuracy in determining the quality of the ejection operations of the outlets 314a to 314d. Such a structure of the ejection inspection part 5 is particularly suitable for use in determining the quality of the ejection operation of the ejection head having a plurality of outlet rows arranged in parallel.

In the ejection inspection part 5, as described above, the light existing plane inclines relative to a plane perpendicular to the predetermined ejection direction of the processing liquid. This reduces the possibility of the bright dots 81 overlapping one another, the normal ejection determination frames 85 overlapping one another, and the oblique ejection determination frames 87 overlapping one another in the inspection image 8. As a result, it is possible to further improve the accuracy in determining the quality of the ejection operations of the outlets 314a to 314d. Such a structure of the ejection inspection part 5 is also particularly suitable for use in determining the quality of the ejection operation of the ejection head having a plurality of outlet rows arranged in parallel with one another.

Figure 10:
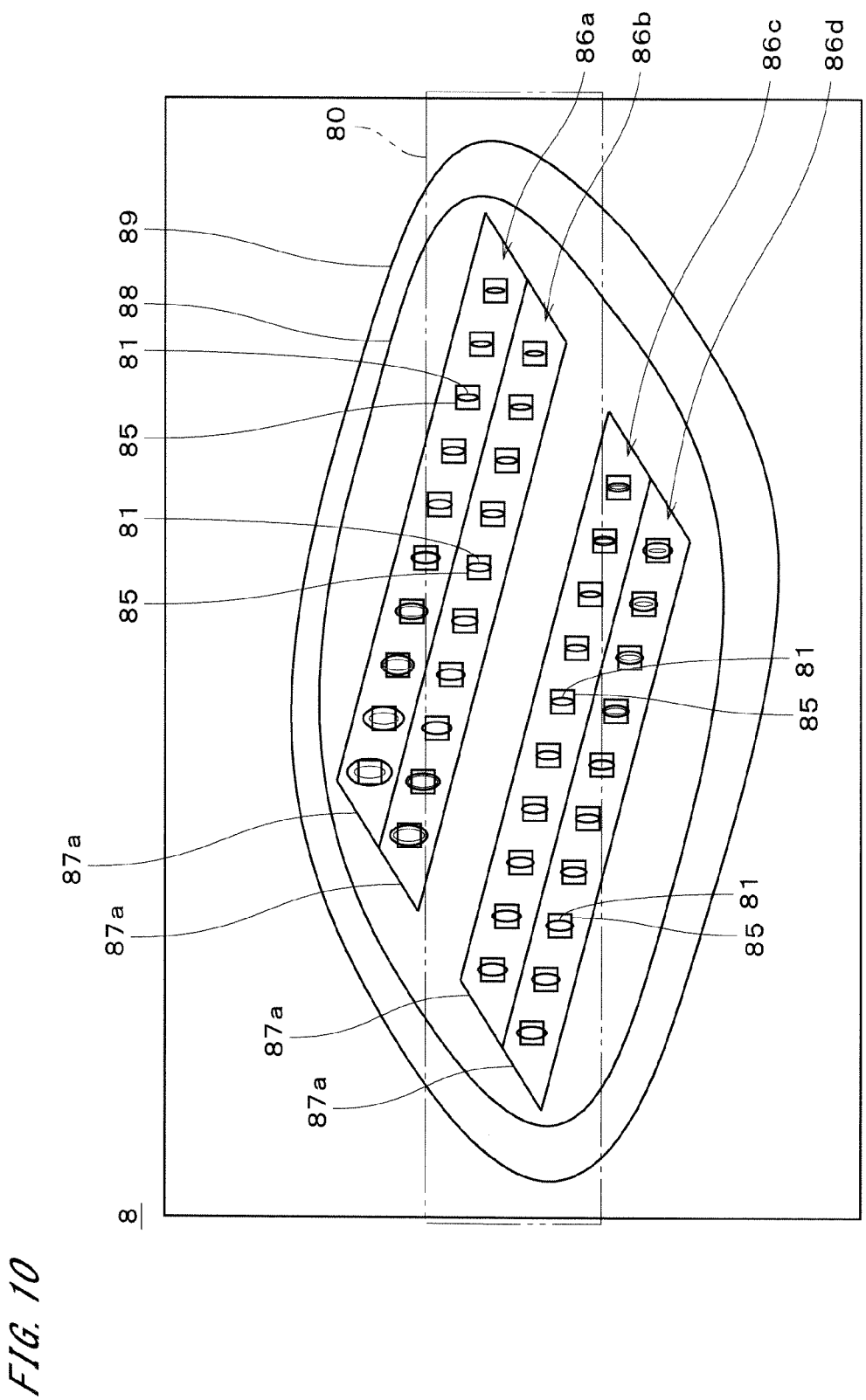
FIG. 10 illustrates an inspection image.

The above example describes a case of setting the same number of oblique ejection determination frames 87 as the number of normal ejection determination frames 85, but it is also possible for the determination frame setting part 74 to set relatively large oblique ejection determination frames 87a, each including a plurality of normal ejection determination frames 85, in the inspection image 8, as shown in FIG. 10. In the example shown in FIG. 10, a single oblique ejection determination frame 87a that is substantially rectangular in shape is set around a plurality of normal ejection determination frames 85 (i.e., the first normal ejection determination frame row 86a) that correspond respectively to all of the first outlets 314a (see FIG. 3) in the first outlet row 313a. Oblique ejection determination frames 87a of substantially the same shape as the above oblique ejection determination frame 87a are also set respectively around the second normal ejection determination frame row 86b, the third normal ejection determination frame row 86c, and the fourth normal ejection determination frame row 86d. The positions of the respective oblique ejection determination frames 87a in the inspection image 8 are determined on the basis of the positions of their corresponding normal ejection determination frame rows. A protection-liquid-film ejection determination frame 88 similar to that described above is set around the four oblique ejection determination frames 87a, and a maximum ejection determination frame 89, which is the outer ejection determination frame, is set around the protection-liquid-film ejection determination frame 88.

In the inspection calculation part 73, the determination part 75 determines the quality of the ejection operations of the outlets 314a to 314d, which correspond respectively to the normal ejection determination frames 85, on the basis of the aforementioned existence information indicating the existence or non-existence of bright dots 81 in the respective normal ejection determination frames 85, in the respective oblique ejection determination frames 87a, in the protection-liquid-film ejection determination frame 88, and in the maximum ejection determination frame 89. Specific examples of determining the quality of the ejection operations will be described below with reference to FIGS. 11A to 11E.

Figure 11A:
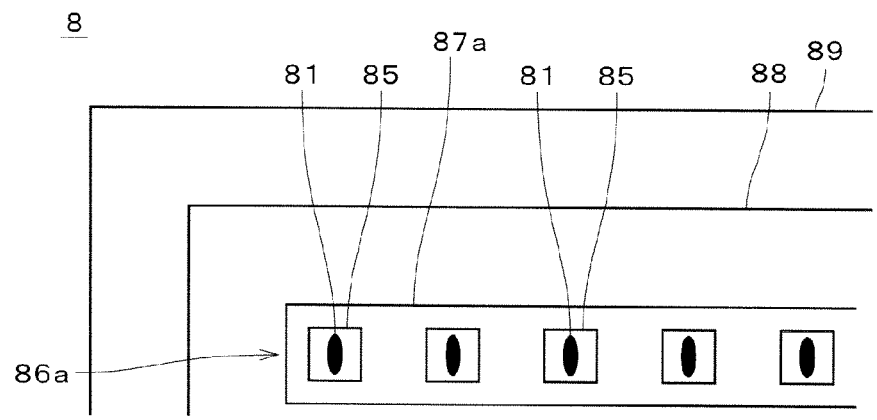
FIGS. 11A to 11E illustrate a portion of an inspection image.

In the case of FIG. 11A, similarly to FIG. 9A, the determination part 75 acquires, as the existence information on bright dots 81, information indicating that there is one bright dot 81 in each of the five normal ejection determination frames 85 and information indicating that there is no bright dot 81 in the area outside the normal ejection determination frames 85. The determination part 75 then determines, on the basis of the existence information, that the ejection operations of the five first outlets 314a that correspond respectively to the five normal ejection determination frames 85 are satisfactory (i.e., normal).

Figure 11B:
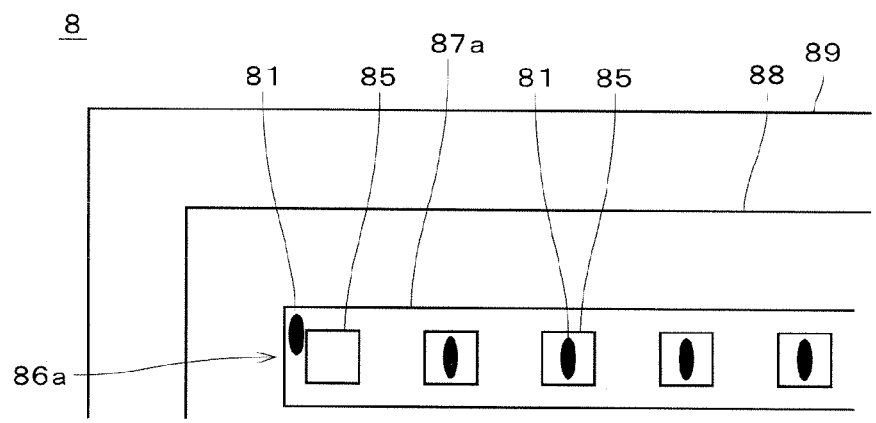

In the case of FIG. 11B, the determination part 75 acquires, as the existence information on bright dots 81, information indicating that there is no bright dot 81 in the first normal ejection determination frame 85 from the left, but there is one bright dot 81 in each of the other four normal ejection determination frames 85, and information indicating that there is one bright dot 81 in an oblique ejection determination frame 87a. The determination part 75 also acquires, as the existence information on bright dots 81, information indicating that the bright dot 81 in the oblique ejection determination frame 87a is located in the vicinity of the first normal ejection determination frame 85 from the left, and information indicating that there is no bright dot 81 in the protection-liquid-film ejection determination frame 88 or the maximum ejection determination frame 89.

The determination part 75 then determines, on the basis of the above existence information, that the ejection operations of the four first outlets 314a that correspond respectively to the second to fifth normal ejection determination frames 85 from the left are satisfactory. As for the first outlet 314a that corresponds to the first normal ejection determination frame 85 from the left, the determination part 75 determines that there is an ejection failure where the processing liquid is ejected in a direction deviating from the normal ejection range (so-called "oblique ejection"), because there is no bright dot 81 in this normal ejection determination frame 85, and there is one bright dot 81 in the oblique ejection determination frame 87a in the vicinity of this normal ejection determination frame 85. The occurrence of the ejection failure is notified to an operator or the like by the determination part 75 via the notification part 79 such as a monitor of the ejection inspection part 5, and maintenance of the ejection head 31 is performed.

Note that the determination part 75 does not necessarily have to identify the outlet that corresponds to the bright dot 81 in the oblique ejection determination frame 87a. In this case, as for the first outlet 314a that is positioned first on the left, the determination part 75 determines that an ejection failure of either oblique ejection or no ejection has occurred. It is also determined that oblique ejection to the area corresponding to the oblique ejection determination frame 87a has occurred in one of the first outlets 314a in the first outlet row 313a.

Figure 11C:
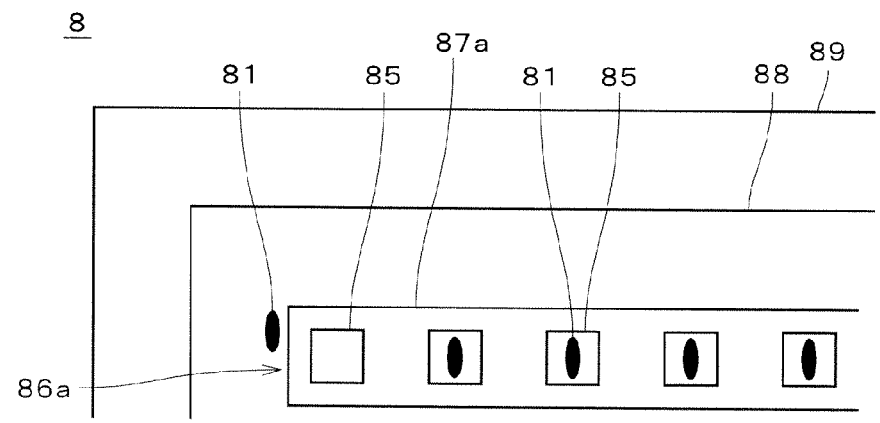

In the case of FIG. 11C, the determination part 75 acquires, as the existence information on bright dots 81, information indicating that there is no bright dot 81 in the first normal ejection determination frame 85 from the left, but there is one bright dot 81 in each of the other four normal ejection determination frames 85, information indicating that there is no bright dot 81 in the oblique ejection determination frame 87a or the maximum ejection determination frame 89, and information indicating that there is one bright dot 81 in the protection-liquid-film ejection determination frame 88. The determination part 75 determines, on the basis of this existence information, that the ejection operations of the four first outlets 314a that correspond respectively to the second to fifth normal ejection determination frames 85 from the left are satisfactory.

As for the first outlet 314a that corresponds to the first normal ejection determination frame 85 from the left, the determination part 75 determines that an ejection failure has occurred where the processing liquid is ejected very obliquely in a direction deviating from the range of oblique ejection corresponding to the oblique ejection determination frame 87a, because there is no bright dot 81 in the normal ejection determination frame 85 corresponding to that first outlet 314a and there is also no bright dot 81 in the oblique ejection determination frame 87a, but there is a bright dot 81 in the vicinity of the normal ejection determination frame 85 within the protection-liquid-film ejection determination frame 88. The determination part 75 also determines that the processing liquid ejected from that first outlet 314a toward the substrate 9 will land on the protection liquid film 93. The occurrence of the ejection failure is notified to an operator or the like by the determination part 75 via the notification part 79 such as a monitor of the ejection inspection part 5, and maintenance of the ejection head 31 is performed.

Note that the determination part 75 does not necessarily have to identify the outlet that corresponds to the bright dot 81 in the protection-liquid-film ejection determination frame 88. In this case, as for the first outlet 314a that is positioned first on the left, the determination part 75 determines that an ejection failure of either no ejection or very oblique ejection to the area outside the range corresponding to the oblique ejection determination frame 87a has occurred. It is also determined that very oblique ejection where the processing liquid lands on the area that is outside the areas corresponding to the oblique ejection determination frames 87a and that is within the protection liquid film 93 has occurred in one of the above first outlet 314a and other outlets 314a to 314d (not shown).

Figure 11D:
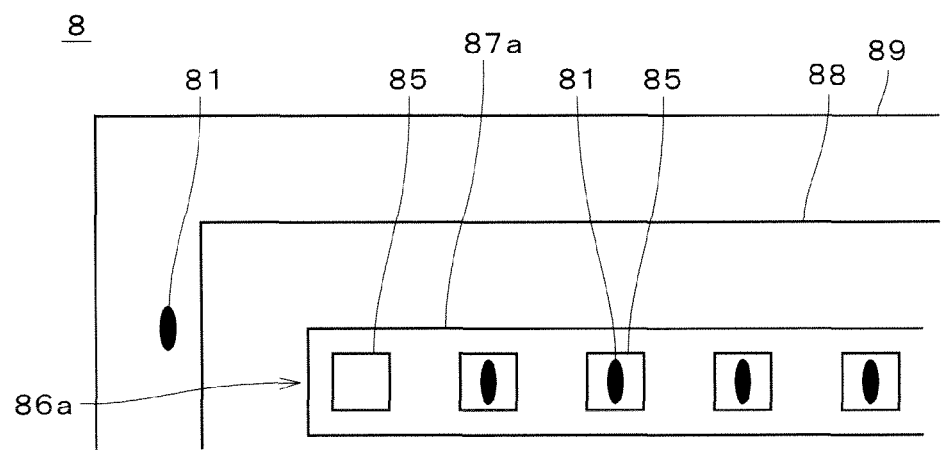

In the case of FIG. 11D, the determination part 75 acquires, as the existence information on bright dots 81, information indicating that there is no bright dot 81 in the first normal ejection determination frame 85 from the left, but there is one bright dot 81 in each of the other four normal ejection determination frames 85, information indicating that there is no bright dot 81 in the oblique ejection determination frame 87a or the protection-liquid-film ejection determination frame 88, and information indicating that there is one bright dot 81 in the maximum ejection determination frame 89. The determination part 75 determines, on the basis of the existence information, that the ejection operations of the four first outlets 314a that correspond respectively to the second to fifth normal ejection determination frames 85 from the left are satisfactory.

As for the first outlet 314a that correspond to the first normal ejection determination frame 85 from the left, the determination part 75 determines that the processing liquid is ejected in a direction deviating considerably from the ejection direction and the processing ejected toward the substrate 9 will land on the area outside the protection liquid film 93, because there is no bright dots 81 in the normal ejection determination frame 85 corresponding to this first outlet 314a, the oblique ejection determination frame 87a, or the protection-liquid-film ejection determination frame 88, and there is a bright dot 81 in the maximum ejection determination frame 89. The occurrence of the ejection failure is notified to an operator or the like by the determination part 75 via the notification part 79 such as a monitor of the ejection inspection part 5, and, for example, the ejection head 31 is disassembled for maintenance or replaced with another ejection head 31.

Note that the determination part 75 does not necessarily have to identify the outlet that corresponds to the bright dot 81 in the maximum ejection determination frame 89. In this case, as for the first outlet 314a that is positioned first on the left, the determination part 75 determines that an ejection failure of either no ejection or extremely oblique ejection to the area outside the protection liquid film 93 has occurred. The determination part 75 also determines that extremely oblique ejection to the area outside the protection liquid film 93 has occurred in one of the above first outlet 314a and the other outlets 314a to 314d (not shown).

Figure 11E:
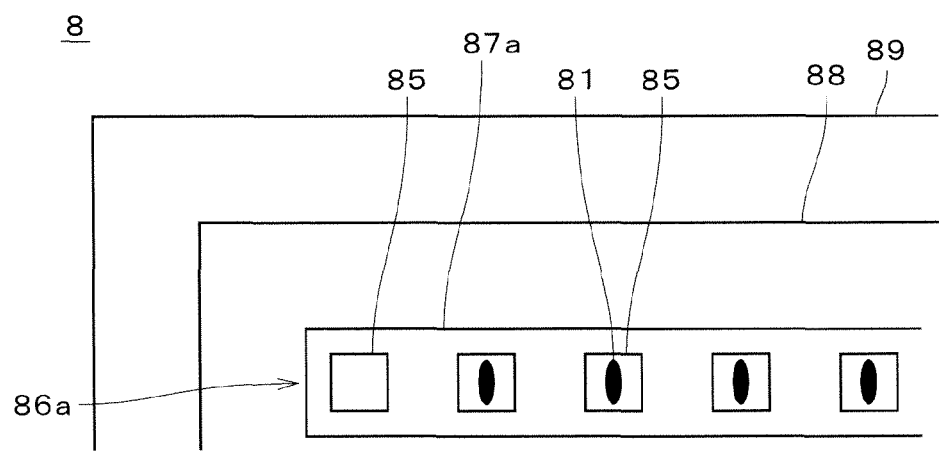

In the case of FIG. 11E, the determination part 75 acquires, as the existence information on bright dots 81, information indicating that there is no bright dot 81 in the first normal ejection determination frame 85 from the left, but there is one bright dot 81 in each of the other four normal ejection determination frames 85, and information indicating that there is no bright dot 81 in the oblique ejection determination frame 87a, the protection-liquid-film ejection determination frame 88, or the maximum ejection determination frame 89. The determination part 75 determines, on the basis of the existence information, that the ejection operations of the four first outlets 314a that correspond respectively to the second to fifth normal ejection determination frames 85 from the left are satisfactory. The determination part 75 also determines that an ejection failure of no ejection where the processing liquid is not ejected has occurred in the first outlet 314a corresponding to the first normal ejection determination frame 85 from the left.

In this way, even in the case where a single oblique ejection determination frame 87a is set around a plurality of normal ejection determination frames 85, the determination part 75 can similarly acquire the existence information indicating the existence or non-existence of bright dots 81 in the respective normal ejection determination frames 85 and determine, on the basis of the existence information, the quality of the ejection operations of the outlets 314a to 314d corresponding respectively to the normal ejection determination frames 85. Accordingly, it is possible to individually and accurately determine the quality of the ejection operations of the respective outlets 314a to 314d.

In the ejection inspection part 5, the existence information indicating the existence or non-existence of bright dots 81 in the respective oblique ejection determination frames 87a is acquired and used as a basis to determine whether or not an oblique ejection has occurred in any of the outlet rows 313a to 313d corresponding respectively to the oblique ejection determination frames 87a. Accordingly, it is possible to accurately detect the occurrence of oblique ejection in the outlets 314a to 314d. Note that each of the oblique ejection determination frames 87a may be set so as to surround two or more outlet rows.

With the substrate processing apparatus 1, it is possible that the ejection head 31, when moved to the inspection position, may be disposed at a position slightly shifted from the design inspection position. The shift in the inspection position of the ejection head 31 causes a shift in the positions of the light emitting part 51 and the imaging part 52 relative to the ejection head 31. Since the positions of the normal ejection determination frames 85, the oblique ejection determination frames 87 or 87a, the protection-liquid-film ejection determination frame 88, and the maximum ejection determination frame 89 in the inspection image 8 are set based on the assumption that the ejection head 31 is disposed at the design inspection position, a shift in the inspection position of the ejection head 31 will change the positional relationship between the ejection determination frames (i.e., the normal ejection determination frames 85, the oblique ejection determination frames 87 or 87a, the protection-liquid-film ejection determination frame 88, and the maximum ejection determination frame 89) and the bright dots 81 of the processing liquid ejected from the ejection head 31 in the inspection image 8. This raises a possibility that, even if the processing liquid is normally ejected in the predetermined ejection direction, bright dots 81 may be formed outside the normal ejection determination frames 85 and determined as ejection abnormalities.

In view of this, if there is a concern about a shift in the inspection position of the ejection head 31, the substrate processing apparatus 1 may operates such that the determination frame setting part 74, when setting ejection determination frames, sets the positions of the normal ejection determination frames 85 on the basis of the actual positions of the bright dots 81 in the inspection image 8. Specifically, the determination frame setting part 74 first obtains, in the inspection image 8, the positions (i.e., the coordinates) of two bright dots 81 that are located at opposite ends among a plurality of bright dots 81 that correspond to the first outlet row 313a in the inspection image 8. The determination frame setting part 74 then sets the positions of two normal ejection determination frames 85 that center on the obtained two bright dots 81.

If the processing liquid is ejected as designed, a plurality of bright dots 81 corresponding to the first outlet row 313a will be arranged in a straight line and accordingly, a plurality of normal ejection determination frames 85 that correspond to the first outlet row 313a will also be arranged in a straight line. Thus, a plurality of normal ejection determination frames 85 are set so as to be arranged in a straight line between the aforementioned two normal ejection determination frames 85. The intervals in the inspection image 8 between the bright dots 81 of the processing liquid ejected from the adjacent first outlets 314a decrease as the distance from the imaging part 52, which serves as an observation viewpoint, increases (i.e., in the direction from the near side to the far side). Accordingly, the intervals between the aforementioned normal ejection determination frames 85 also need to be reduced similarly with increasing distance from the imaging part 52. The positions of the normal ejection determination frames 85 are, for example, set such that the interval between each pair of adjacent normal ejection determination frames 85 (e.g., the interval between the centers of the normal ejection determination frames 85) decreases a predetermined distance each in the direction from the near side to the far side.

As an alternative method, the coordinates of the aforementioned bright dot reference positions (i.e., the positions at which the bright dots 81 are to be formed when the processing liquid is ejected as designed) that correspond respectively to the first outlets 314a are obtained in the three-dimensional coordinate system set by the substrate processing apparatus 1. Then, the coordinates of bright dot projection positions are obtained, which are positions obtained by projecting the bright dot reference positions on a virtual plane that passes through a bright dot reference position (hereinafter, referred to as a "first end position") that corresponds to a first outlet 314a located at one end of the first outlet row 313a and that is perpendicular to the imaging axis J2 of the imaging part 52.

The projection of each of the bright dot reference positions is performed in the direction from the bright dot reference position to the starting point of the imaging axis J2 (i.e., the center of the object-side end face of the imaging part 52 in the optical system). The calculation of the coordinates of the bright dot projection positions is performed using, for example. Menelaus' theorem on the basis of a triangle formed by the starting point of the imaging axis J2, the first end position, and a second end position that is a bright dot projection position corresponding to the first outlet 314a located at the other end of the first outlet row 313a, and a straight line connecting the first end position and the second end position. Then, in accordance with the proportion of the interval between each pair of adjacent bright dot projection positions in the distance between the first end position and the second end position, a plurality of normal ejection determination frames 85 are disposed between the aforementioned two normal ejection determination frames 85 (i.e., the two normal ejection determination frames 85 corresponding to the first outlets 314a located at the opposite ends) in the inspection image 8.

In this way, the determination frame setting part 74 sets the positions of the normal ejection determination frames 85 corresponding to the first outlet row 313a on the basis of the positions of the two bright dots 81 corresponding to the first outlets 314a located at the opposite ends of the first outlet row 313a in the inspection image 8. The positions of a plurality of normal ejection determination frames 85 that correspond to the second outlet row 313b, the third outlet row 313c, and the fourth outlet row 313d are also set in the same manner as the case of setting the positions of the normal ejection determination frames 85 corresponding to the first outlet row 313a. Thus, even if the inspection position of the ejection head 31 shifts from the design inspection position, it is possible to accurately determine the quality of the ejection operations of the outlets 314a to 314d.

As described above, when the positions of a plurality of normal ejection determination frames 85 are set on the basis of the positions of the bright dots that correspond to the outlets located at the opposite ends of each outlet row, the positions of the oblique ejection determination frames 87 (see FIG. 7) that each surround one of the normal ejection determination frames 85 are set on the basis of the positions of the respective normal ejection determination frames 85. On the other hand, the position of each oblique ejection determination frame 87a (see FIG. 10) that surrounds a plurality of normal ejection determination frames 85 is set on the basis of the positions of the normal ejection determination frames 85 that are located at the opposite ends of a normal ejection determination frame row. The positions of the protection-liquid-film ejection determination frame 88 and the maximum ejection determination frame 89 are set on the basis of the positions of the normal ejection determination frames 85 and the oblique ejection determination frames 87 or 87a.

In the substrate processing apparatus 1, if the distance between the imaging part 52 and the processing liquid changes, the sizes of the bright dots 81 in the inspection image 8, i.e., apparent sizes of the bright dots 81 will also change. For example, bright dots 81 far from the imaging part 52 will have smaller apparent sizes than bright dots 81 close to the imaging part 52 and accordingly will have smaller apparent amounts of movement due to oblique ejection. Thus, when the existence or non-existence of bright dots 81 in the ejection determination frames such as the normal ejection determination frames 85 is determined, bright dots 81 far from the imaging part 52 are more likely to be determined as existing in the ejection determination frames than bright dots 81 closer to the imaging part even in the case where they deviates from their bright dot reference positions due to oblique ejection.

On the other hand, since bright dots 81 close to the imaging part 52 have larger apparent sizes than bright dots 81 far from the imaging part 52, there is a higher possibility that portions of bright dots 81 close to the imaging part 52 will be located within ejection determination frames even in the case where the centroids of these bright dots 81 are located outside the ejection determination frames. Accordingly, bright dots 81 that are located closer to the imaging part 52 and whose centroids are located outside the ejection determination frames are more likely to be determined as existing in the ejection determination frames than bright dots 81 far from the imaging part 52.

In the substrate processing apparatus 1, some of the bright dots 81 may be located outside the in-focus range 80 of the imaging part 52, depending on the layout of the ejection head 31, the light emitting part 51, and the imaging part 52. In this case, those bright dots 81 are blurred (so-called "out of focus") in the inspection image 8 and enlarged as compared with the other bright dots 81 located within the in-focus range 80. There is a higher possibility that at least a portion of the enlarged bright dots 81 will be located within ejection determination frames. Thus, when the existence or non-existence of bright dots 81 in the ejection determination frames such as the normal ejection determination frames 85 is determined, such enlarged bright dots 81 are more likely to be determined as existing in the ejection determination frames, than the other bright dots 81.

In view of this, the ejection inspection part 5 performs an adjustment to reduce the influence that the distance between the imaging part 52 and the bright dots 81 and the blurring of bright dots 81 located outside the in-focus range 80 would have on the process of determining the quality of the ejection operations. The following describes two types of adjustment methods. A first adjustment method is for adjusting the sizes of the normal ejection determination frames 85 when the determination frame setting part 74 sets the normal ejection determination frames 85. A second adjustment method is for correcting the sizes of the bright dots 81 in the inspection image 8 before the determination part 75 determines the quality of the ejection operations.

Figure 12:
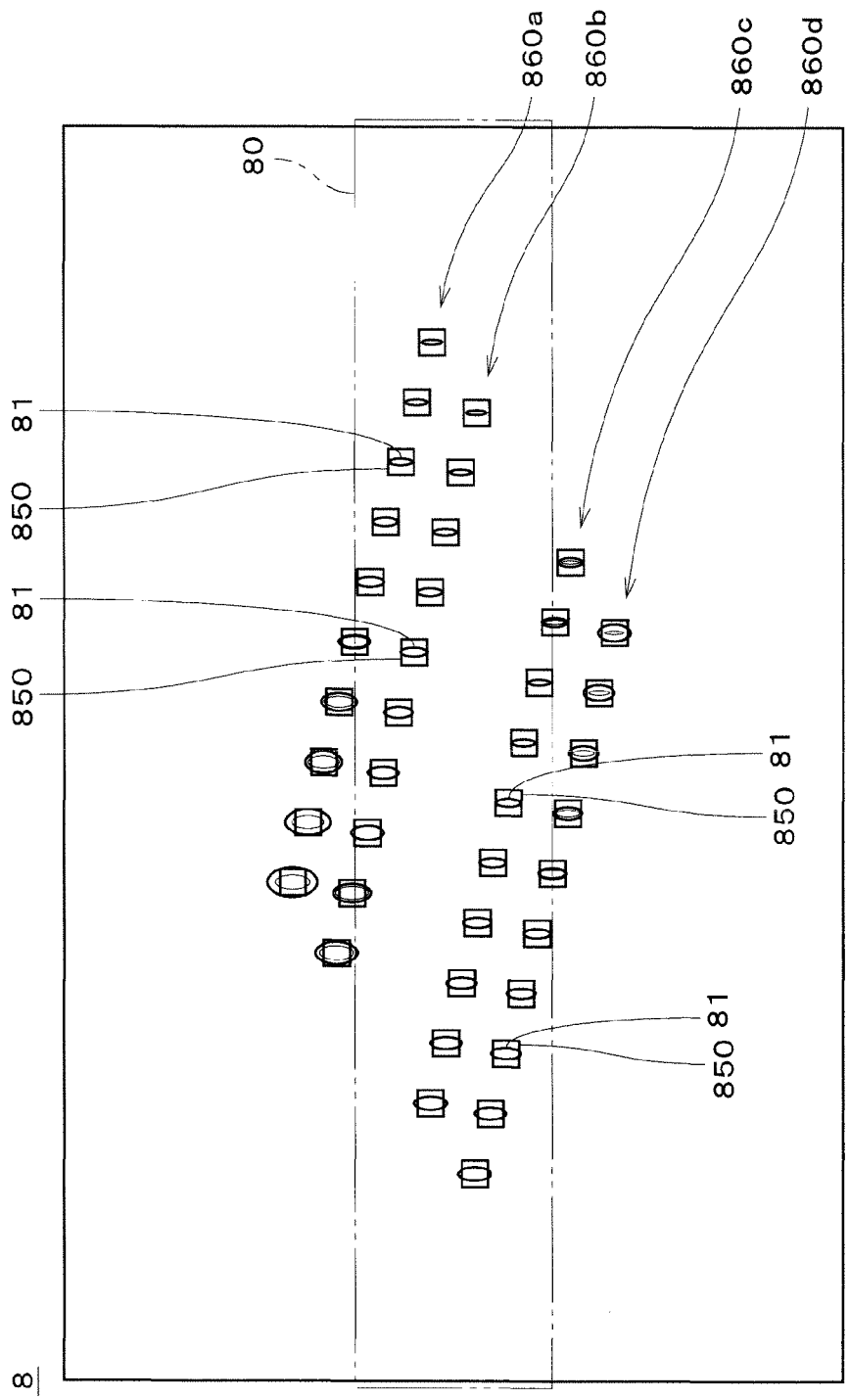
FIGS. 12 to 16 illustrate an inspection image.

According to the first adjustment method, first, the provisional setting part 77 (see FIG. 4) of the determination frame setting part 74 provisionally sets a plurality of normal ejection determination frames of the same shape that correspond respectively to a plurality of outlets 314a to 314d and that respectively center on the aforementioned plurality of bright dot reference positions in the inspection image 8 as shown in FIG. 12. The provisionally set normal ejection determination frames (hereinafter, referred to as "provisional setting frames 850") obtained by the provisional setting part 77 are substantially rectangular in shape and have a size defined in advance. In FIG. 12, provisional setting frames 850 on the left are close to the imaging part 52 and provisional setting frames 850 on the right are far from the imaging part 52 in four provisional setting frame rows 860a to 860d that will respectively be the first normal ejection determination frame row 86a, the second normal ejection determination frame row 86b, the third normal ejection determination frame row 86c, and the fourth normal ejection determination frame row 86d after an adjustment is performed by the frame size adjustment part 78. Note that FIG. 12 shows only the bright dots 81 and the provisionally set normal ejection determination frames and does not show the other ejection determination frames such as the oblique ejection determination frames. The same applies to FIGS. 13 to 16, which will be described later.

Figure 13:
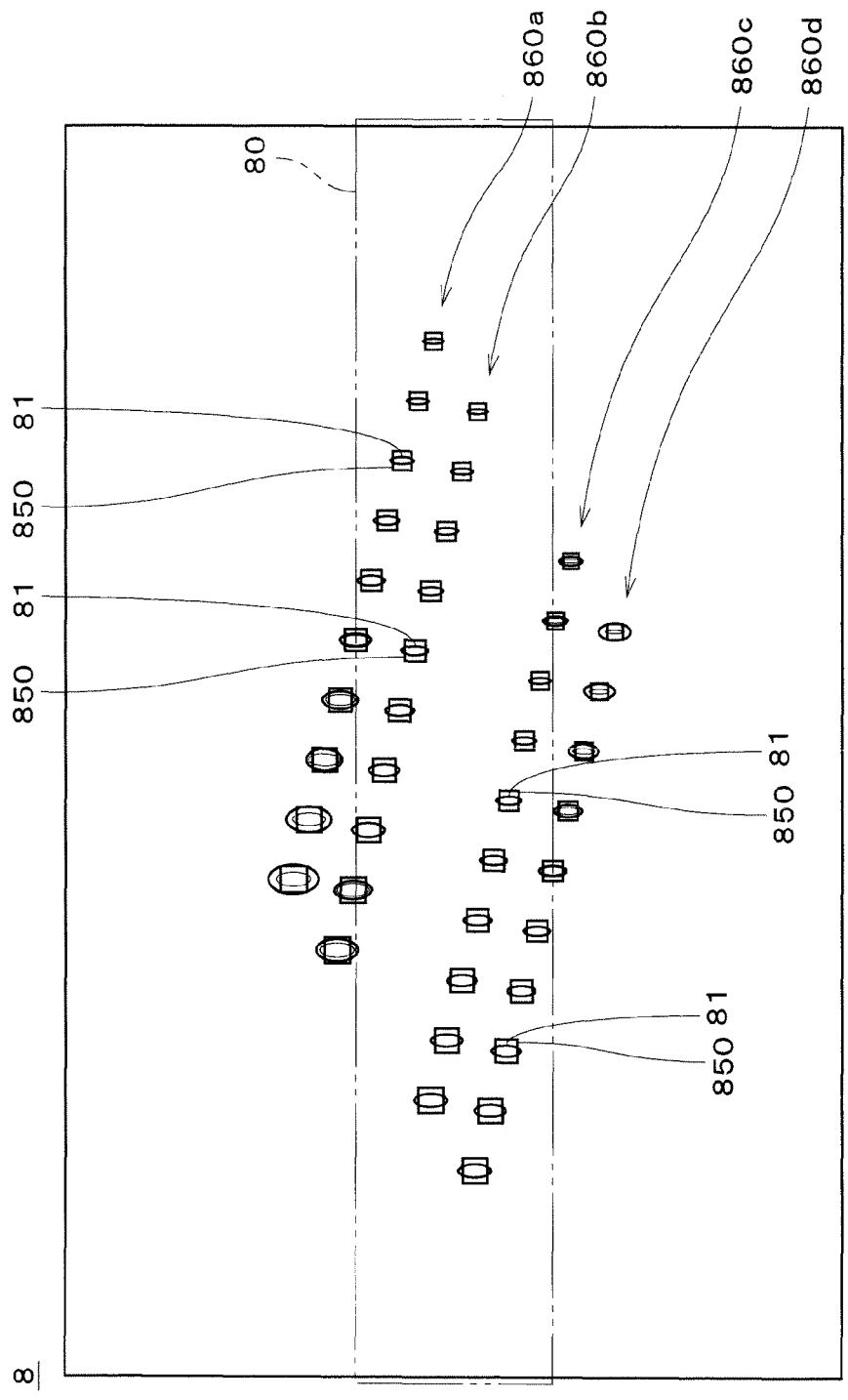

Then, the frame size adjustment part 78 obtains, for each of the provisional setting frames 850, an inspection distance that is a distance between the starting point of the imaging axis J2 of the imaging part 52 and the bright dot reference position corresponding to the provisional setting frame 850. Then, the apparent frame size adjustment part 78a of the frame size adjustment part 78 adjusts the provisional setting frame 850 on the basis of the obtained inspection distance. Specifically, the adjustment is performed so as to decrease the size of the provisional setting frame 850 with increasing inspection distance. To be more specific, taking a frame reduction ratio as a predetermined function of the inspection distance that decreases with increasing inspection distance of a provisional setting frame 850 of interest, the size of the provisional setting frame 850 is adjusted by multiplying the length of each of the four sides of the provisional setting frame 850 by the frame reduction ratio without changing the center position of the provisional setting frame 850 (i.e., the bright dot reference position) as shown in FIG. 13. In each of the provisional setting frame rows 860a to 860d, the length of each side of the provisional setting frames 850 decreases as the provisional setting frames 850 get closer to the right side in FIG. 13. The aforementioned function is, for example, set to "1" when the inspection distance is equal to the distance between the bright dot reference position closest to the imaging part 52 and the imaging part 52, and set to be less than 1 when the inspection distance is greater than that distance.

Then, the defocus frame size adjustment part 78b of the frame size adjustment part 78 further performs an adjustment such that the size of each of the provisional setting frames 850 adjusted by the processing described in FIG. 13 decreases with increasing difference (hereinafter, referred to as the "amount of defocus") between the in-focus distance of the imaging part 52 and the inspection distance corresponding to the provisional setting frame 850. Consequently, the normal ejection determination frames 85 are set. Specifically, taking the amount of blurring as a predetermined function of the amount of defocus that increases with increasing amount of defocus, the amount of blurring is subtracted from the length of each of the four sides of each provisional setting frame 850 without changing the center position of the provisional setting frame 850. As a result, the normal ejection determination frames 85 are set as shown in FIG. 14.

Figure 14:
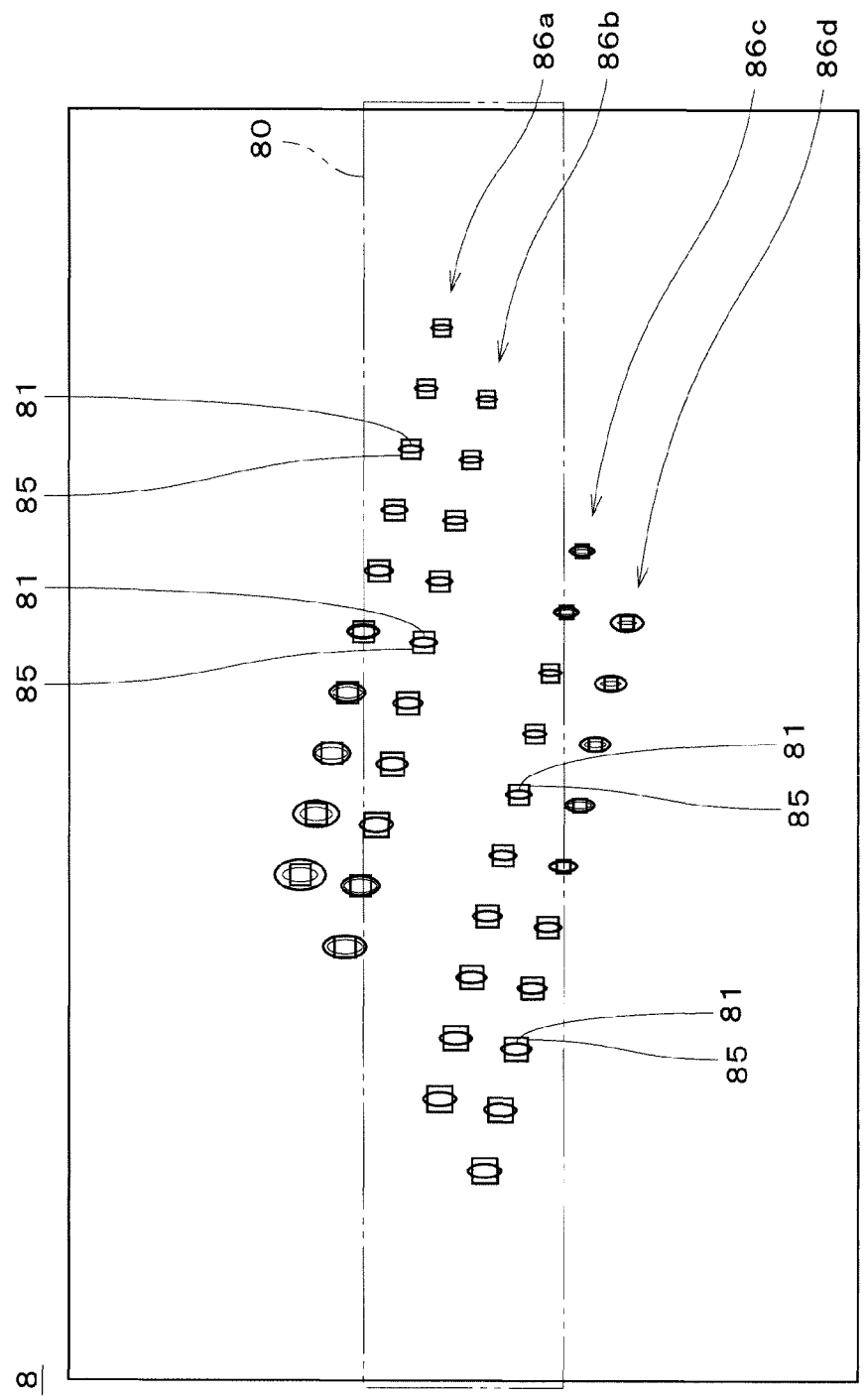

In the examples shown in FIGS. 12 to 14, bright dots 81 located in the vicinity of a central portion in the vertical direction are included in the in-focus range 80. Thus, referring to the provisional setting frame rows 860a and 860b on the upper side in FIG. 13 (i.e., on the front side in the three-dimensional coordinate system), some of the provisional setting frames 850 on the right side are set as normal ejection determination frames 85 without changing the sizes. The other provisional setting frames 850 in the provisional setting frame rows 860a and 860b are reduced in size by subtracting the amount of blurring from each side. As shown in FIG. 14, in the provisional setting frame rows 860a and 860b (i.e., the first normal ejection determination frame row 86a and the second normal ejection determination frame row 86b), the amount of blurring subtracted from each of the provisional setting frames 850 increases as the provisional setting frames 850 get closer to the left side in FIG. 14.

Meanwhile, referring to the provisional setting frame rows 860c and 860d on the lower side in FIG. 13, some of the provisional setting frames 850 on the left are set as normal ejection determination frames 85 without changing the sizes. The other provisional setting frames 850 in the provisional setting frame rows 860c and 860d are reduced in size by subtracting the amount of blurring from each side. As shown in FIG. 14, in the provisional setting frame rows 860c and 860d (i.e., the third normal ejection determination frame row 86c and the fourth normal ejection determination frame row 86d), the amount of blurring subtracted from each side of the provisional setting frames 850 increases as the provisional setting frames 850 get closer to the right side in FIG. 14.

The oblique ejection determination frames 87 that correspond respectively to the bright dot reference positions are also provisionally set in the inspection image 8 by the provisional setting part 77 and adjusted in size by the frame size adjustment part 78, similarly to the aforementioned adjustments of the normal ejection determination frames 85.

The substrate processing apparatus 1 determines, on the basis of existence information on bright dots 81 in the aforementioned size-adjusted normal ejection determination frames 85, the quality of the ejection operations of the outlets 314a to 314d. As described above, the adjustment of the normal ejection determination frames 85 involves reducing the size of each of the provisional setting frames 850 with increasing inspection distance corresponding to the provisional setting frame 850. Accordingly, it is possible to reduce the influence that the distance between the imaging part 52 and the bright dots 81 would have on the process of determining the quality of the ejection operations and to thereby improve the accuracy in determining the quality of the ejection operations.

The adjustment also involves reducing the size of each of the provisional setting frames 850 with increasing amount of defocus, which is a difference between the inspection distance corresponding to the provisional setting frame 850 and the in-focus distance of the imaging part 52. Accordingly, it is possible to reduce the influence that the blurring of the bright dots 81 located outside the in-focus range 80 would have on the process of determining the quality of the ejection operations and to thereby further improve the accuracy in determining the quality of the ejection operations.

In the above example, the frame size adjustment part 78 performs both of the adjustment using the apparent frame size adjustment part 78a and the adjustment using the defocus frame size adjustment part 78b on each of the provisional setting frames 850, but the frame size adjustment part 78 does not necessarily have to perform both of the adjustments. The normal ejection determination frames 85 may be set by the frame size adjustment part 78 using at least one of the apparent frame size adjustment part 78a and the defocus frame size adjustment part 78b to adjust each of the provisional setting frames 850. Consequently, it is possible, as described above, to reduce the influence that the distance between the imaging part 52 and the bright dots 81 would have on the process of determining the quality of the ejection operations and to thereby improve the accuracy in determining the quality of the ejection operations.

The above example describes the correction of the ejection determination frames in the case of setting the same number of oblique ejection determination frames 87 as the number of normal ejection determination frames 85, but even if a single oblique ejection determination frame 87a is set around a plurality of normal ejection determination frames 85 as shown in FIG. 10, the normal ejection determination frames 85 can be set in the same manner.

Next is a description of the aforementioned second adjustment method. According to the second adjustment method, first, the determination frame setting part 74 sets a plurality of normal ejection determination frames 85 of the same shape that correspond respectively to the outlets 314a to 314d and that respectively center on the aforementioned bright dot reference positions in the inspection image 8 as shown in FIG. 12. The normal ejection determination frames 85 are substantially rectangular in shape and have a size defined in advance.

Figure 15:
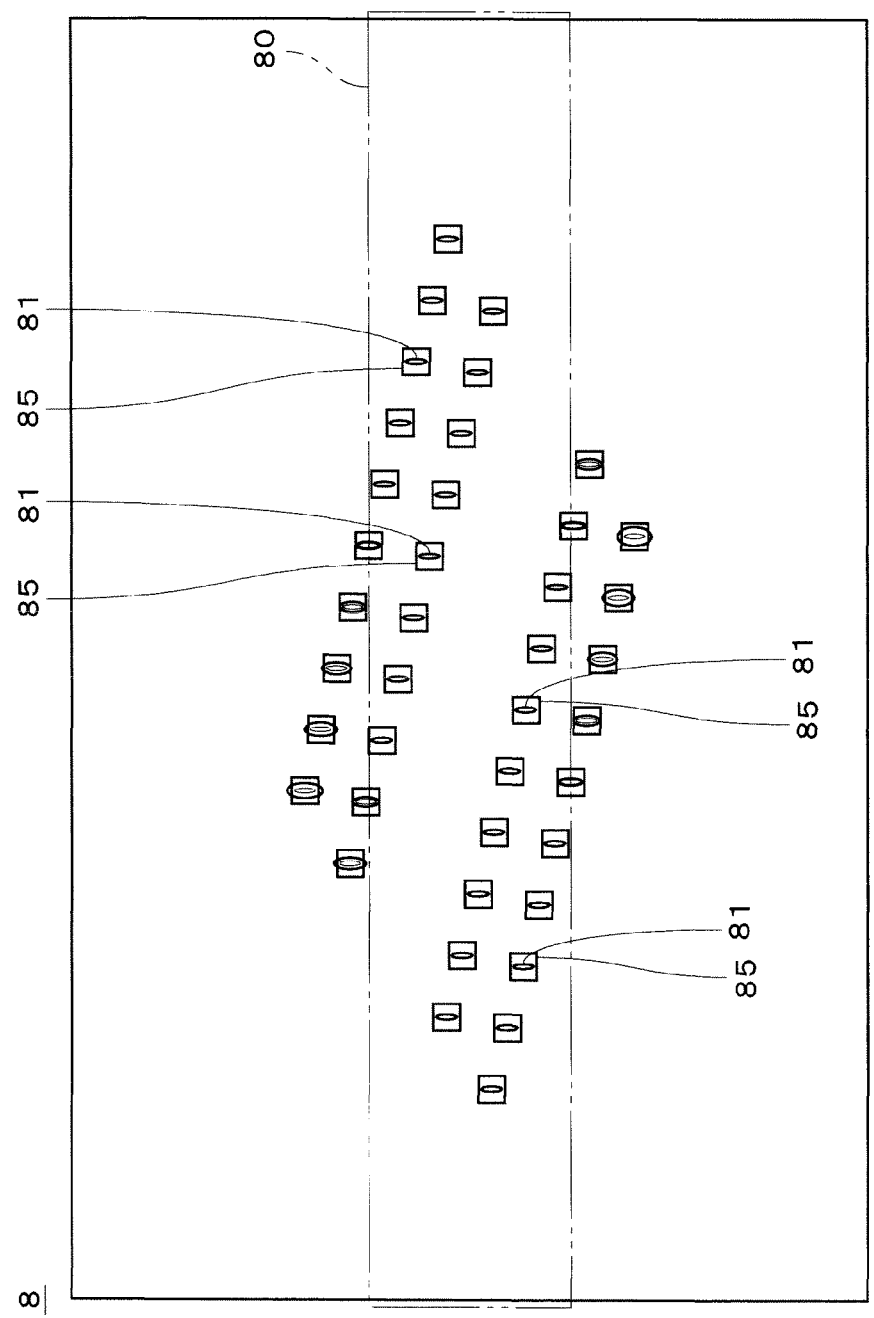

Next, the bright dot correction part 76 obtains an inspection distance that is a distance between the bright dot reference position corresponding to each of the bright dots 81 in the inspection image 8 and the starting point of the imaging axis J2 of the imaging part 52. Then, the apparent bright dot size adjustment part 76a performs a correction such that the sizes of the bright dots 81 decrease with decreasing inspection distance. Specifically, taking a bright-dot reduction ratio as a predetermined function of the inspection distance that decreases with decreasing inspection distance, the size of each of the bright dots 81 is reduced at the bright-dot reduction ratio without changing the center location of the bright dot 81. Accordingly, the sizes of the bright dots 81 are corrected as shown in FIG. 15.

Figure 16:
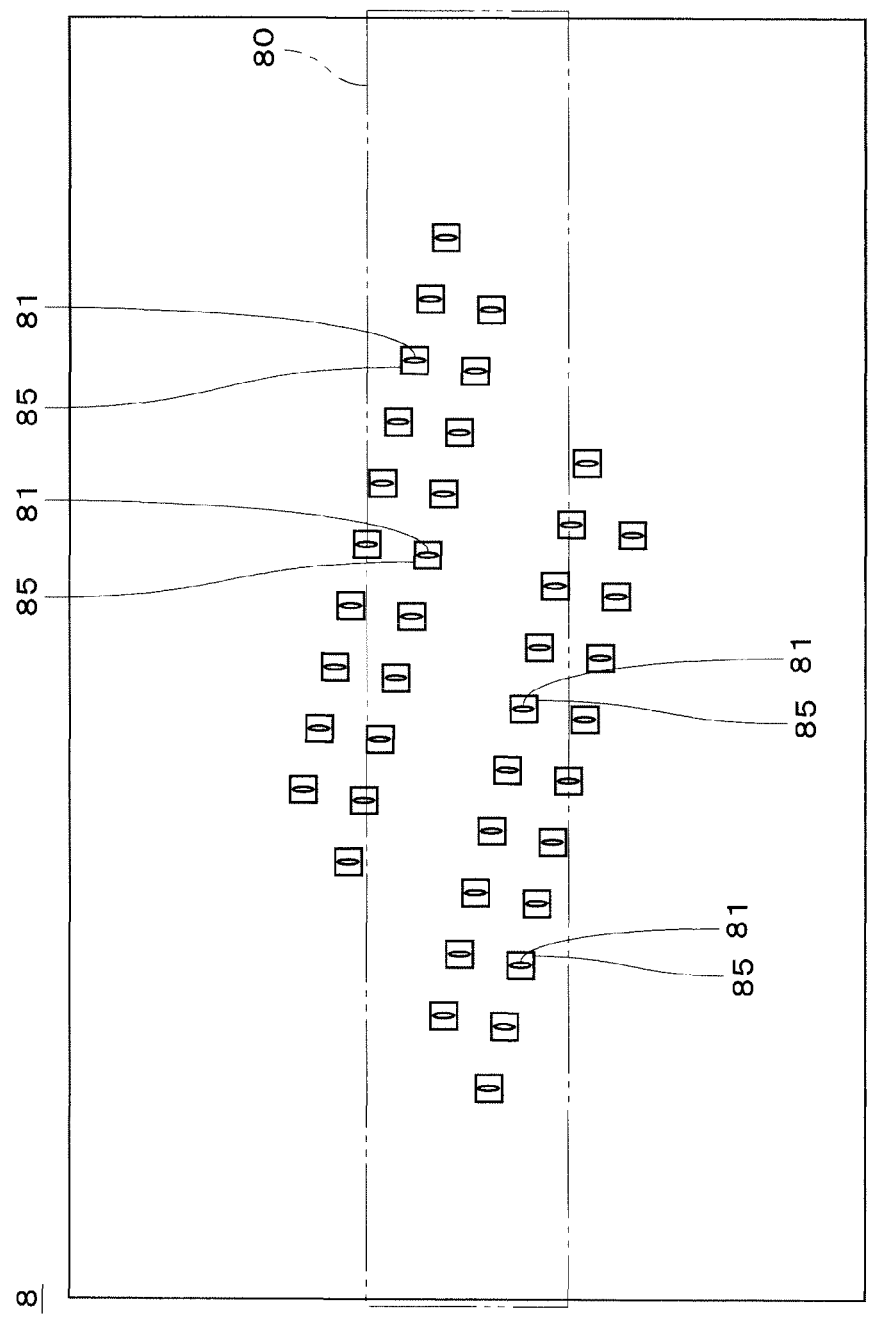

Then, the defocus bright dot size adjustment part 76b of the bright dot correction part 76 corrects the size of each of the bright dots 81 such that the size of the bright dot 81 decreases with increasing amount of defocus, which is a difference between the in-focus distance of the imaging part 52 and the inspection distance corresponding to the bright dot 81. Specifically, taking the amount of bright-dot blurring as a predetermined function of the amount of defocus that increases with increasing amount of defocus, the size of each bright dot 81 is corrected by subtracting the amount of bright-dot blurring from each of the horizontal and vertical lengths of the bright dot 81 without changing the center location of the bright dot 81, as shown in FIG. 16.

In the substrate processing apparatus 1, the determination part 75 determines the quality of the ejection operations of the outlets 314a to 314d on the basis of existence information on the size-corrected bright dots 81 in the normal ejection determination frames 85 (i.e., information indicating whether or not at least a portion of the corrected bright dots 81 exists). As described above, the correction of the bright dots 81 is performed so as to decrease the size of each bright dot 81 with decreasing inspection distance corresponding to the bright dot 81 (i.e., as the bright dot reference position corresponding to the bright dot 81 gets closer to the imaging part 52). This prevents or reduces the possibility that only a portion of a bright dot 81 is located within the normal ejection determination frames 85 irrespective of the fact that a most portion of the bright dot 81 is located outside the normal ejection determination frame 85. Consequently, it is possible to reduce the influence that the distance between the imaging part 52 and the bright dot 81 would have on the process of determining the quality of the ejection operations and to thereby improve the accuracy in determining the quality of the ejection operations.

Another correction is also performed so as to decrease the size of each bright dot 81 with increasing amount of defocus, which is a difference between the inspection distance corresponding to the bright dot 81 and the in-focus distance of the imaging part 52. Accordingly, it is possible to reduce the influence that the blurred bright dots 81 located outside the in-focus range 80 would have on the process of determining the quality of the ejection operations and to thereby further improve the accuracy in determining the quality of the ejection operations.

In the above example, the bright dot correction part 76 performs the correction by the apparent bright dot size correction part 76a and the correction by the defocus bright dot size correction part 76b on each of the bright dots 81, but the bright dot correction part 76 does not necessarily have to performed both of the corrections. The bright dot correction part 76 uses at least one of the apparent bright dot size correction part 76a and the defocus bright dot size correction part 76b to correct the size of each bright dot 81. Then, the determination part 75 acquires existence information on bright dots 81 in the normal ejection determination frames 85 and determines, on the basis of this existence information, the quality of the ejection operations of the outlets 314a to 314d. Consequently, it is possible, as described above, to reduce the influence that the distance between the imaging part 52 and the bright dots 81 would have on the process of determining the quality of the ejection operations and to thereby improve the accuracy in determining the quality of the ejection operations.

While the above example describes a case of correcting the bright dots 81 when the number of oblique ejection determination frames 87 to be set is the same as the number of normal ejection determination frames 85, the bright dots 81 can also be corrected in a similar manner even in the case where a single oblique ejection determination frame 87a includes a plurality of normal ejection determination frames 85 as shown in FIG. 10.

In the substrate processing apparatus 1, an increase in the vertical thickness of the planar light 510 emitted from the light emitting part 51 increases the size of each bright dot 81 in the vertical direction (i.e., in the design ejection direction of the processing liquid) in the inspection image 8 acquired by the imaging part 52. The thickness of the planar light 510 emitted from the light emitting part 51 is substantially constant over the area to which the processing liquid ejected from the ejection head 31 is applied. However, even in that area, the thickness of the planar light 510 gradually increases by a slight amount with increasing distance from a position at which the planar light 510 emitted from the light emitting part 51 has the smallest thickness in the ejection direction (i.e., a position at which the planar light 510 is most concentrated in the vertical direction and that is hereinafter referred to as a "light thinnest position"). Accordingly, bright dots 81 far from the light thinnest position have larger sizes, in the vertical direction, than bright dots 81 close to the light thinnest position. Consequently, at the time of determining the existence or non-existence of bright dots 81 in ejection determination frames such as the normal ejection determination frames 85, bright dots 81 far from the light thinnest position are more likely to be determined as existing in the ejection determination frames, than bright dots 81 close to the light thinnest position.

In view of this, the ejection inspection part 5 performs an adjustment to reduce the influence that the distance between the light thinnest position and the bright dots 81 would have on the process of determining the quality of the ejection operations. The following describes two types of adjustment methods. In order to distinguish these two methods from the above-described first and second adjustment methods, the two types of methods described here are respectively referred to as a "third adjustment method" and a "fourth adjustment method." According to the third adjustment method, the sizes of the normal ejection determination frames 85 are adjusted when the determination frame setting part 74 sets the normal ejection determination frames 85. According to the fourth adjustment method, the sizes of the bright dots 81 in the inspection image 8 are corrected before the determination part 75 determines the quality of the ejection operations.

According to the third adjustment method, the light thickness adjustment part 78c of the frame size adjustment part 78 adjusts the height of each of the normal ejection determination frames 85 in the vertical direction (i.e., in the design ejection direction of the processing liquid) on the basis of a "determination-frame irradiation distance error that is a difference between an irradiation distance and a light thinnest distance, the irradiation distance being a distance in the direction parallel to the optical axis J1 between the starting point of the optical axis J1 of the light emitting part 51 and the bright dot reference position corresponding to the normal ejection determination frame 85, and the light thinnest distance being a distance in the direction parallel to the optical axis J1 from the starting point of the optical axis J11 of the light emitting part 51 to the light thinnest position. Specifically, each of the normal ejection determination frames 85 is reduced in size in the vertical dimension with increasing determination-frame irradiation distance error that corresponds to the normal ejection determination frame 85. Accordingly, it is possible to reduce the influence that the determination-frame irradiation distance error would have on the process of determining the quality of the ejection operations and to thereby improve the accuracy in determining the quality of the ejection operations.

According to the fourth adjustment method, the light thickness correction part 76c of the bright dot correction part 76 adjusts the vertical level of each bright dot 81 on the basis of a bright-dot irradiation distance error that is a difference between the light thinnest distance and the irradiation distance of the bright dot 81 (i.e., the distance in the direction parallel to the optical axis J1 between the starting point of the optical axis J1 of the light emitting part 51 and the bright dot reference position corresponding to the bright dot 81). Specifically, each of the bright dots 81 is reduced in size in the vertical direction with increasing bright-dot irradiation distance error corresponding to the bright dot 81. Accordingly, it is possible to reduce the influence that the bright-dot irradiation distance error would have on the process of determining the quality of the ejection operations and to thereby improve the accuracy in determining the quality of the ejection operations.

The above-described four adjustment methods may be appropriately combined for use. For example, the first and the third adjustment methods may be used in combination to adjust the sizes of the normal ejection determination frames 85. Alternatively, the second and fourth adjustment methods may be used in combination to adjust the sizes of the bright dots 81. As another alternative, any two or more of the first to fourth adjustment methods may be used in combination.

In the above description about the determination part 75 determining the existence or non-existence of bright dots 81 in ejection determination frames such as the normal ejection determination frames 85, the determination part 75 determines that a bright dot 81 exists in an ejection determination frame if at least a portion of the bright dot 81 is located within the ejection determination frame. However, the determination part 75 may also determine that a bright dot 81 exists in an ejection determination frame only if at least half of the bright dot 81 is located within the ejection determination frame. Alternatively, the determination part 75 may determine that a bright dot 81 exists in an ejection determination frame only if the entire bright dot 81 is located within the ejection determination frame. In this case, the defocus frame size adjustment part 78b adjusts the sizes of the provisional setting frames 850 so as to enlarge the provisional setting frames 850 by adding the amount of blurring to each side of the provisional setting frames 850, as the amount of defocus increases. This reduces the influence that the blurred bright dots 81 located outside the in-focus range 80 would have on the process of determining the quality of the ejection operations, and further improves the accuracy in determining the quality of the ejection operations. Also, the light thickness adjustment part 78c adjusts the normal ejection determination frames 85 so as to enlarge the normal ejection determination frame 85 in the vertical direction as the determination-frame irradiation distance error increases. This reduces the influence that the determination-frame irradiation distance error would have on the process of determining the quality of the ejection operations and thereby improves the accuracy in determining the quality of the ejection operations.

The determination part 75 may be configured to obtain the center of each of the bright dots 81 in the inspection image 8 and acquire whether or not the centroid of each of the bright dots 81 exists in the corresponding normal ejection determination frame 85 as the existence information on the bright dot 81 in the normal ejection determination frame 85. This prevents, for example, the possibility that only a blurred portion of a bright dot 81 located outside the in-focus range 80 will be located within a normal ejection determination frame 85 and this bright dot 81 will be determined as existing in the normal ejection determination frame 85. The same applies to the process of determining the existence or non-existence of bright dots 81 in the other ejection determination frames. As a result, it is possible to further improve the accuracy in determining the quality of the ejection operations of the outlets 314a to 314d. The determination as to the existence or non-existence of a bright dot 81 depending on the presence or absence of the centroid of the bright dot 81 in an ejection determination frame may be performed using the above first or third adjustment method in combination. It is, however, noted that the determination as to the existence or non-existence of a bright dot 81 depending on the presence or absence of the centroid of the bright dot 81 is not performed when using the aforementioned second and fourth adjustment methods.

The substrate processing apparatus 1 described above can be modified in various ways.

In the above-described ejection inspection part 5, the determination frame setting part 74 sets the normal ejection determination frames 85, the oblique ejection determination frames 87 or 87a, the protection-liquid-film ejection determination frame 88, and the maximum ejection determination frame 89, but it is not always necessary to set all of these ejection determination frames. The ejection inspection part 5 may cause the determination frame setting part 74 to set only one type of the ejection determination frames or to set two or three types of the ejection determination frames in combination.

For example, the maximum ejection determination frame 89 corresponding to the area outside the protection liquid film 93 may be omitted. In this case, the protection-liquid-film ejection determination frame 88 serves as the outer ejection determination frame located on the outermost side of a plurality of ejection determination frames. Also, the determination part 75 determines the ejection operation of each of the outlets 314a to 314d as one of the following: normal ejection, oblique ejection to the area corresponding to the oblique ejection determination frame 87 or 87a, very oblique ejection to the area that is outside the area corresponding to the oblique ejection determination frame 87 or 87a but is on the protection liquid film 93, and other ejection failures. Examples of the other ejection failures include no ejection and extremely oblique ejection where the processing liquid lands on the area outside the protection liquid film 93.

Among the ejection determination frames, the protection-liquid-film ejection determination frame 88 may be omitted. In this case, the maximum ejection determination frame 89 is set around a plurality of oblique ejection determination frames 87 or 87a. Then, the ejection operation of each of the outlets 314a to 314d is determined as one of the following: normal ejection, oblique ejection to the area corresponding to the oblique ejection determination frame 87 or 87a, very oblique ejection to the area outside the area corresponding to the ejection determination frame 87 or 87a, and no ejection.

When the oblique ejection determination frames 87 or 87a are omitted from among the ejection determination frames, the ejection operation of each of the outlets 314a to 314d is determined as one of the following: normal ejection, oblique ejection to the protection liquid film 93, extremely oblique ejection where the processing liquid lands on the area outside the protection liquid film 93, and no ejection. When the oblique ejection determination frames 87 or 87a and the protection-liquid-film ejection determination frame 88 are omitted, the ejection operation of each of the outlets 314a to 314d is determined as one of normal ejection, oblique ejection, and no ejection. When the normal ejection determination frames 85 and the oblique ejection determination frames 87 or 87a are omitted, the ejection operation of each of the outlets 314a to 314d is determined as one of the following: ejection where the processing liquid lands on the protection liquid film 93, ejection where the processing liquid lands on the area outside the protection liquid film 93, and no ejection.

While, in the above description, no ejection and oblique ejection are determined as ejection failures in the outlets 314a, other ejection operations may also be determined as ejection failures. For example, there are cases where droplets ejected from the ejection head 31 may be dispersed into a plurality of micro droplets during flight. Such micro droplets may fail to transfer sufficient kinetic energy to the upper surface 91 of the substrate 9 and accordingly may not be able to appropriately clean the substrate 9. Thus, the ejection of such micro droplets may also be determined as an ejection failure. If the ejection of micro droplets is determined as an ejection failure, the determination may be made, for example, such that a case where a single bright dot 81 is detected in a normal ejection determination frame 85 is determined as normal ejection, and a case where a plurality of bright dots 81a are detected in a normal ejection determination frame 85 is determined as an ejection failure.

In the above descriptions, when bright dots 81 are located outside the in-focus range 80 of the imaging part 52, either the sizes of ejection determination frames such as the normal ejection determination frames 85 is adjusted using the first adjustment method, or the sizes of bright dots 81 are adjusted using the second adjustment method. However, even if some of the bright dots 81 are located outside the in-focus range 80, the sizes of ejection determination frames or the bright dots 81 do not necessarily have to be adjusted as long as the accuracy in determining the quality of the ejection operations is at a permissible level. The adjustment of the sizes of ejection determination frames such as the normal ejection determination frame 85 using the third adjustment method or the adjustment of the sizes of bright dots 81 using the fourth adjustment method does not necessarily have to be performed if, for example, the vertical thickness of the planar light 510 changes little with the above irradiation distance. Prior to determining the quality of the ejection operations, the ejection inspection part 5 may reduce the sizes of the bright dots 81 centered on the center positions of the bright dots 81 in the vertical direction so that the vertical and horizontal dimensions of the bright dots 81 become approximately equal.

The light emitting part 51 does not necessarily have to emit planar light. The light emitting part 51 may emit light that extends forward in a straight line along the light existing plane, and this light may be scanned along the light existing plane with an optical scanner such as a polygon mirror. In this case, the processing liquid ejected from the outlets 314a to 314d, i.e., a plurality of flying droplets, are irradiated with this light when passing through the light existing plane. The light existing plane may be perpendicular to the design ejection direction of the processing liquid ejected from the ejection head 31, and the imaging direction of the imaging part 52 may be parallel to the plane perpendicular to the design ejection direction.

The light emitting part 51 and the imaging part 52 may be located at positions other than positions obliquely below the ejection head 31, and for example, they may be located obliquely above the ejection head 31. The ejection inspection part 5 may be located at a position other than in the vicinity of the standby position of the ejection head 31 (i.e., in the vicinity of the standby pod 4). For example, the light emitting part 51 and the imaging part 52 may be located obliquely above the ejection head 31 located above the substrate 9.

The processing liquid ejected from the ejection head 31 does not necessarily have to be in the form of droplets, and the ejection head 31 may eject a continuous flow of processing liquid in the form of a liquid column.

The substrate processing apparatus 1 is applicable to various types of processing other than cleaning the substrates 9. The substrate processing apparatus 1 may be used for processing of substrates other than semiconductor substrates, such as glass substrates used in display devices such as liquid crystal displays, plasma displays, and FEDs (field emission displays). The substrate processing apparatus 1 may also be used for processing of other substrates such as optical disk substrates, magnetic disk substrates, magneto-optical disk substrates, photomask substrates, ceramic substrates, and solar cell substrates.

An apparatus constituted by the light emitting part 51, the imaging part 52, the determination frame setting part 74, and the determination part 75 described above may be used as an independent ejection inspection apparatus that is provided independently of the other constituent elements of the substrate processing apparatus 1. Also, an apparatus constituted by the light emitting part 51, the imaging part 52, the determination frame setting part 74, the determination part 75, and the bright dot correction part 76 may be used as an independent ejection inspection apparatus that is provided independently of the other constituent elements of the substrate processing apparatus 1. These ejection inspection apparatuses can be used, for example, to inspect the operations of ejecting a liquid from a plurality of outlets in an apparatus for ejecting a liquid toward various substrates as described above from a plurality of outlets.

The configurations of the above-described preferred embodiments and variations may be appropriately combined as long as there are no mutual inconsistencies.

While the invention has been shown and described in detail, the foregoing description is in all aspects illustrative and not restrictive. It is therefore understood that numerous modifications and variations can be devised without departing from the scope of the invention. This application claims priority benefit under 35 U.S.C. Section 119 of Japanese Patent Application No. 2013-052192 filed in the Japan Patent Office on Mar. 14, 2013, Japanese Patent Application No. 2013-052193 filed in the Japan Patent Office on Mar. 14, 2013, and Japanese Patent Application No. 2013-052194 filed in the Japan Patent Office on Mar. 14, 2013, the entire disclosures of which are incorporated herein by reference.

REFERENCE SIGNS LIST

1 Substrate processing apparatus
5 Ejection inspection part
8 Inspection image
9 Substrate
21 Substrate holding part
31 Ejection head
36 Protection liquid supply part
51 Light emitting part
52 Imaging part
74 Determination frame setting part
75 Determination part
81 Bright dot
85 Normal ejection determination frame
87, 87a Oblique ejection determination frame
88 Protection-liquid-film ejection determination frame
89 Maximum ejection determination frame
93 Protection liquid film
314a to 314d Outlet
314e Peripheral outlets
316 Outlet arrangement area
510 Planar light

The invention claimed is:

1. An ejection inspection apparatus for inspecting an operation of ejecting a liquid from a plurality of outlets, comprising:
   a light emitter for emitting planar light along a predetermined light existing plane to irradiate a plurality of flying droplets passing through said light existing plane with the planar light, said plurality of flying droplets being a liquid ejected from a plurality of outlets;
   an image capturing device for capturing an image of said plurality of flying droplets while said plurality of flying droplets passes through said light existing plane to acquire an inspection image that includes a plurality of bright dots appearing on said plurality of flying droplets; and
   a controller programmed to:
      obtain said inspection image and set, in said inspection image, a plurality of normal ejection determination frames corresponding respectively to said plurality of outlets on the basis of coordinates of a bright dot reference position of each of said plurality of bright dots, said bright dot reference position being a point of intersection of said light existing plane and a center line of ejection that extends from each of said plurality of outlets in a design ejection direction of said plurality of flying droplets; and
      acquire existence information that indicates whether or not a bright dot exists in each of said plurality of normal ejection determination frames and determining quality of an ejection operation of an outlet corresponding to said each normal ejection determination frame on the basis of said existence information.

2. The ejection inspection apparatus according to claim 1, wherein
   an imaging direction of said image capturing device inclines relative to a plane perpendicular to a predetermined direction of ejection of said plurality of flying droplets.

3. The ejection inspection apparatus according to claim 1, wherein
   said light existing plane inclines relative to a plane perpendicular to a predetermined direction of ejection of said plurality of flying droplets.

4. The ejection inspection apparatus according to claim 1, wherein
   said plurality of outlets are linearly arranged, and
   said controller is further programmed to set positions of said plurality of normal ejection determination frames on the basis of positions of bright dots that are located at opposite ends among said plurality of bright dots included in said inspection image.

5. The ejection inspection apparatus according to claim 1, wherein said controller is further programmed to:
   set a plurality of oblique ejection determination frames respectively around said plurality of normal ejection determination frames, and
   determine occurrence or non-occurrence of an oblique ejection at an outlet corresponding to each of said plurality of oblique ejection determination frames on the basis of existence information indicating whether or not a bright dot exists in said each oblique ejection determination frame.

6. The ejection inspection apparatus according to claim 1, wherein said controller is further programmed to:
   set a single oblique ejection determination frame around said plurality of normal ejection determination frames, and
   determine occurrence or non-occurrence of an oblique ejection on the basis of existence information indicating whether or not a bright dot exists in said oblique ejection determination frame.

7. The ejection inspection apparatus according to claim 1, wherein
   said controller is further programmed to obtain a centroid of each of said plurality of bright dots in said inspection image and acquires existence or non-existence of the centroid of a bright dot in said each normal ejection determination frame as said existence information indicating whether or not a bright dot exists in said each normal ejection determination frame.

8. The ejection inspection apparatus according to claim 1, wherein said controller is further programmed to correct a size of each of said plurality of bright dots in said inspection image on the basis of a length of an inspection distance that is a distance between said image capturing device and said bright dot reference position, and
   said existence information is information indicating whether or not at least a portion of a bright dot corrected by said controller exists in said each normal ejection determination frame.

9. The ejection inspection apparatus according to claim 8, wherein said controller is further programmed to perform correction to decrease the size of said each bright dot as said inspection distance decreases.

10. The ejection inspection apparatus according to claim 8, wherein
    said controller is further programmed to perform correction to decrease the size of said each bright dot as a difference between said inspection distance and an in-focus distance of said image capturing device increases.

11. The ejection inspection apparatus according to claim 8, wherein said controller is further programmed to reduce a size of said each bright dot in said ejection direction as a difference between an irradiation distance and a distance from said light emitter to a light thinnest position increases, said irradiation distance being a distance between said light emitter and said bright dot reference position in a direction parallel to an optical axis between said light emitter and said bright dot reference position, and said light thinnest position being a position at which the light emitted from said light emitter has a smallest thickness in said ejection direction.

12. The ejection inspection apparatus according to claim 1, wherein said controller is further programmed to:
    provisionally set, in said inspection image, a normal ejection determination frame of a predetermined size in correspondence with each of said plurality of outlets, said normal ejection determination frame centering on said bright dot reference position; and
    adjust each normal ejection determination frame on the basis of an inspection distance that is a distance between said bright dot reference position and said image capturing device.

13. The ejection inspection apparatus according to claim 12, wherein said controller is further programmed to perform adjustment to decrease the size of said each normal ejection determination frame as said inspection distance increases.

14. The ejection inspection apparatus according to claim 12, wherein said controller is further programmed to perform adjustment to decrease the size of said each normal ejection determination frame as a difference between said inspection distance and an in-focus distance of said image capturing device increases.

15. The ejection inspection apparatus according to claim 12, wherein said controller is further programmed to reduce the size of said each normal ejection determination frame in said ejection direction as a difference between an irradiation distance and a distance between said light emitter and a light thinnest position increases, said irradiation distance being a distance between said light emitter and said bright dot reference position in a direction parallel to an optical axis between said light emitter and said bright dot reference position, and said light thinnest position being a position at which the light emitted from said light emitter has a smallest thickness in said ejection direction.

16. A substrate processing apparatus comprising:
a substrate holder for holding a substrate;
an ejection head for ejecting a liquid from a plurality of outlets toward said substrate and performing predetermined processing on said substrate; and
an ejection inspection apparatus for inspecting an operation of said ejection head ejecting a liquid from said plurality of outlets,
said ejection inspection apparatus including:
a light emitter for emitting planar light along a predetermined light existing plane to irradiate a plurality of flying droplets passing through said light existing plane with the light, said plurality of flying droplets being the liquid ejected from said plurality of outlets;
an image capturing device for capturing an image of said plurality of flying droplets while said plurality of flying droplets passes through said light existing plane to acquire an inspection image that includes a plurality of bright dots appearing on said plurality of flying droplets; and
a controller programmed to:
obtain said inspection image and setting, in said inspection image, a plurality of normal ejection determination frames corresponding respectively to said plurality of outlets on the basis of coordinates of a bright dot reference position of each of said plurality of bright dots, said bright dot reference position being a point of intersection of said light existing plane and a center line of ejection that extends from each of said plurality of outlets in a design ejection direction of said plurality of flying droplets; and
acquire existence information that indicates whether or not a bright dot exists in each of said plurality of normal ejection determination frames and determining quality of an ejection operation of an outlet corresponding to said each normal ejection determination frame on the basis of said existence information.

17. The substrate processing apparatus according to claim 16, further comprising
a protection liquid supply for supplying a protection liquid onto said substrate to form a protection liquid film that covers a plurality of design landing positions, on said substrate, of the liquid ejected from said plurality of outlets,
wherein processing for cleaning said substrate is performed by said plurality of outlets ejecting fine droplets of said liquid serving as a cleaning liquid and said fine droplets transferring kinetic energy to said substrate through said protection liquid film.

18. The substrate processing apparatus according to claim 16, wherein
said controller is further programmed to correct a size of each of said plurality of bright dots in said inspection image on the basis of a length of an inspection distance that is a distance between said image capturing device and said bright dot reference position, and
said existence information is information indicating whether or not at least a portion of a bright dot corrected by said controller exists in said each normal ejection determination frame.

19. The substrate processing apparatus according to claim 16, wherein said controller is further programmed to:
provisionally set, in said inspection image, a normal ejection determination frame of a predetermined size in correspondence with each of said plurality of outlets, said normal ejection determination frame centering on said bright dot reference position; and
adjust each normal ejection determination frame on the basis of an inspection distance that is a distance between said bright dot reference position and said image capturing device.

20. A substrate processing apparatus comprising:
a substrate holder for holding a substrate;
a protection liquid supply for supplying a protection liquid onto said substrate to form a protection liquid film that covers a portion of said substrate;
an ejection head for ejecting a liquid from a plurality of outlets toward said protection liquid film formed on said substrate to perform predetermined processing on said substrate; and
an ejection inspection apparatus for inspecting an operation of said ejection head ejecting a liquid from said plurality of outlets,
said ejection inspection apparatus including:
a light emitter for emitting planar light along a predetermined light existing plane to irradiate a plurality of flying droplets passing through said light existing plane with the planar light, said plurality of flying droplets being the liquid ejected from said plurality of outlets;
an image capturing device for capturing an image of said plurality of flying droplets while said plurality of flying droplets passes through said light existing plane to acquire an inspection image that includes a plurality of bright dots appearing on said plurality of flying droplets; and
a controller programmed to:
obtain said inspection image and setting, in said inspection image, a protection-liquid-film ejection determination frame and an outer ejection determination frame, said protection-liquid-film ejection determination frame corresponding to said protection liquid film formed on said substrate, and said outer ejection determination frame surrounding said protection-liquid-film ejection determination frame; and
acquire existence information indicating whether or not a bright dot exists in said outer ejection determination frame and determining occurrence or non-occurrence of landing of the liquid in an area outside said protection liquid film on the basis of said existence information.

21. The substrate processing apparatus according to claim 20, wherein
said protection-liquid-film ejection determination frame in said inspection image is set on the basis of positions of peripheral outlets that are located in a peripheral portion of an outlet arrangement area in which said plurality of outlets are provided in said ejection head, a position of a peripheral portion of said protection liquid film on said substrate, and a position of said light existing plane located between said peripheral outlets and said protection liquid film, and processing for cleaning said substrate is performed by said plurality of outlets ejecting fine droplets of said liquid serving as a cleaning liquid and by said fine droplets transferring kinetic energy to said substrate through said protection liquid film.

\* \* \* \* \*